US009339900B2

(12) United States Patent
Flitsch

(10) Patent No.: US 9,339,900 B2
(45) Date of Patent: May 17, 2016

(54) APPARATUS TO SUPPORT A CLEANSPACE FABRICATOR

(75) Inventor: Frederick A. Flitsch, New Windsor, NY (US)

(73) Assignee: Futrfab, Inc., New Windsor, NY (US)

( * ) Notice: Subject to any disclaimer, the term of this patent is extended or adjusted under 35 U.S.C. 154(b) by 2564 days.

(21) Appl. No.: 11/502,689

(22) Filed: Aug. 12, 2006

(65) Prior Publication Data

US 2007/0059130 A1    Mar. 15, 2007

Related U.S. Application Data

(60) Provisional application No. 60/596,343, filed on Sep. 18, 2005, provisional application No. 61/596,173, filed on Sep. 6, 2005, provisional application No. 60/596,099, filed on Aug. 31, 2005, provisional application No. 60/596,053, filed on Aug. 26, 2005, provisional application No. 60/596,035, filed on Aug. 25, 2005, provisional application No. 60/595,935, filed on Aug. 18, 2005.

(51) Int. Cl.
*B23P 19/04* (2006.01)
*H01L 21/67* (2006.01)
*H01L 21/673* (2006.01)
*H01L 21/677* (2006.01)

(52) U.S. Cl.
CPC ........... *B23P 19/04* (2013.01); *H01L 21/67017* (2013.01); *H01L 21/6719* (2013.01); *H01L 21/67346* (2013.01); *H01L 21/67748* (2013.01); *H01L 21/67769* (2013.01); *H01L 21/67775* (2013.01); *Y10T 29/49826* (2015.01); *Y10T 29/5313* (2015.01); *Y10T 29/53478* (2015.01)

(58) Field of Classification Search
CPC .................. H01L 21/67376; H01L 21/67379; H01L 21/67389; H01L 21/67393; H01L 21/67763; H01L 21/67778; H01L 21/67775; H01L 21/67242; H01L 21/67294; H01L 21/67017; H01L 21/6719; H01L 21/67346; B23P 19/04; Y10T 29/49826; Y10T 29/5313; Y10T 29/53478
USPC .................. 248/213.1, 346.03, 657; 454/187; 901/41; 439/191, 195, 587; 414/217; 700/213
See application file for complete search history.

(56) References Cited

U.S. PATENT DOCUMENTS

| 3,158,457 | A | 11/1964 | Whitefield |
| 3,588,176 | A | 6/1971 | Byrne et al. |
| 3,603,646 | A | 9/1971 | Leoff |
| 3,812,947 | A | 5/1974 | Nygaard |
| 3,930,684 | A | 1/1976 | Lasch, Jr. et al. |
| 3,976,330 | A | 8/1976 | Babinski et al. |

(Continued)

FOREIGN PATENT DOCUMENTS

| EP | 1938370 B1 * | 2/2015 | ........ H01L 21/67017 |
| WO | 2004109748 A2 | 12/2004 | |
| WO | WO-2004/109748 | 12/2008 | |

*Primary Examiner* — Ingrid M Weinhold
(74) *Attorney, Agent, or Firm* — Joseph P. Kincart; Ideation Law, PLLC

(57) ABSTRACT

The present invention provides various aspects of support for a fabrication facility capable of routine placement and replacement of processing tools. Support aspects include support structure for processing tools, a clean environment carrier for a single substrate, and a quick disconnect flange which facilitates connecting and disconnect of electrical, liquid and gas utilities to a processing tool placed in the fabricator.

17 Claims, 33 Drawing Sheets

(56) References Cited

U.S. PATENT DOCUMENTS

| | | |
|---|---|---|
| 4,081,201 A | 3/1978 | Hassan et al. |
| 4,165,132 A | 8/1979 | Hassan et al. |
| 4,278,366 A | 7/1981 | Loveless et al. |
| 4,299,518 A | 11/1981 | Whelan |
| 4,315,705 A | 2/1982 | Flint |
| 4,348,139 A | 9/1982 | Hassan et al. |
| 4,409,889 A | 10/1983 | Burleson |
| 4,501,527 A | 2/1985 | Jacoby et al. |
| 4,554,766 A | 11/1985 | Ziemer et al. |
| 4,612,946 A | 9/1986 | Noh et al. |
| 4,620,353 A | 11/1986 | Pryor |
| 4,649,830 A | 3/1987 | Tanaka |
| 4,667,579 A | 5/1987 | Daw |
| 4,667,580 A | 5/1987 | Wetzel |
| 4,682,927 A | 7/1987 | Southworth et al. |
| 4,694,736 A | 9/1987 | Yamagata et al. |
| 4,695,215 A | 9/1987 | Jacoby et al. |
| 4,699,640 A | 10/1987 | Suzuki et al. |
| 4,722,659 A | 2/1988 | Hoyt, III et al. |
| 4,804,392 A | 2/1989 | Spengler |
| 4,826,360 A | 5/1989 | Iwasawa et al. |
| 4,840,530 A | 6/1989 | Nguyen |
| 4,851,018 A | 7/1989 | Lazzari et al. |
| 4,861,222 A | 8/1989 | Mirkovich |
| 4,867,629 A | 9/1989 | Iwasawa et al. |
| 4,875,825 A | 10/1989 | Tullis et al. |
| 4,923,352 A | 5/1990 | Tamura et al. |
| 4,963,069 A | 10/1990 | Wurst et al. |
| 4,964,776 A | 10/1990 | Wakita et al. |
| 5,029,518 A | 7/1991 | Austin |
| 5,058,491 A | 10/1991 | Wiemer et al. |
| 5,096,477 A | 3/1992 | Shinoda et al. |
| 5,108,513 A | 4/1992 | Muller et al. |
| 5,133,561 A | 7/1992 | Hattori et al. |
| 5,139,459 A | 8/1992 | Takahashi et al. |
| 5,145,303 A | 9/1992 | Clarke |
| 5,167,575 A | 12/1992 | MacDonald |
| 5,217,273 A | 6/1993 | Hendricsen et al. |
| 5,344,365 A | 9/1994 | Scott et al. |
| 5,358,420 A * | 10/1994 | Cairns et al. ............... 439/206 |
| 5,425,793 A | 6/1995 | Mori et al. |
| 5,513,946 A | 5/1996 | Sawada et al. |
| 5,518,451 A | 5/1996 | Renz et al. |
| 5,562,539 A | 10/1996 | Hashimoto et al. |
| 5,570,990 A | 11/1996 | Bonora et al. |
| 5,779,799 A | 7/1998 | Davis |
| 5,795,356 A | 8/1998 | Leveen |
| 5,827,118 A | 10/1998 | Johnson et al. |
| 5,848,933 A | 12/1998 | Roberson et al. |
| 5,860,258 A | 1/1999 | Faith et al. |
| 6,040,235 A | 3/2000 | Badehi |
| 6,082,949 A | 7/2000 | Rosenquist |
| 6,082,951 A * | 7/2000 | Nering et al. ............ 414/217.1 |
| 6,091,498 A * | 7/2000 | Hanson ............ H01L 21/67173 250/559.3 |
| 6,099,599 A | 8/2000 | Wu |
| 6,138,721 A | 10/2000 | Bonora et al. |
| 6,183,358 B1 | 2/2001 | Adair, Jr. |
| 6,186,723 B1 * | 2/2001 | Murata et al. ................. 414/217 |
| 6,220,808 B1 | 4/2001 | Bonora et al. |
| 6,238,283 B1 | 5/2001 | Matsuyama et al. |
| 6,283,701 B1 * | 9/2001 | Sundar et al. ............. 414/744.5 |
| 6,306,189 B1 | 10/2001 | Renz |
| 6,312,525 B1 | 11/2001 | Bright et al. |
| 6,322,597 B1 | 11/2001 | Ohta |
| 6,328,768 B1 | 12/2001 | Ohta |
| 6,338,371 B1 | 1/2002 | Araki et al. |
| 6,382,895 B1 | 5/2002 | Konishi et al. |
| 6,431,948 B1 | 8/2002 | Atoh |
| 6,574,937 B1 | 6/2003 | Rapisarda |
| 6,582,178 B2 | 6/2003 | Petruccelli |
| 6,585,470 B2 * | 7/2003 | Van Der Meulen ........... 414/217 |
| 6,591,162 B1 * | 7/2003 | Martin .......................... 700/228 |
| 6,598,279 B1 * | 7/2003 | Morgan ..................... 29/402.08 |
| 6,612,084 B2 | 9/2003 | Rapisarda |
| 6,654,122 B1 | 11/2003 | Hanson et al. |
| 6,672,820 B1 | 1/2004 | Hanson et al. |
| 6,677,690 B2 | 1/2004 | Fosnight et al. |
| 6,736,582 B1 | 5/2004 | Mages et al. |
| 6,755,221 B2 * | 6/2004 | Jeong et al. ..................... 141/63 |
| 6,776,850 B2 | 8/2004 | Liao et al. |
| 6,854,583 B1 | 2/2005 | Horn |
| 6,869,457 B2 | 3/2005 | Nakagawa |
| 6,875,282 B2 | 4/2005 | Tanaka et al. |
| 6,902,762 B2 | 6/2005 | Miyata |
| 6,955,595 B2 | 10/2005 | Kim |
| 7,014,672 B2 | 3/2006 | Ishihara et al. |
| 7,039,999 B2 | 5/2006 | Tarr et al. |
| 7,077,173 B2 | 7/2006 | Tokunaga |
| 7,083,515 B2 | 8/2006 | Rapisarda et al. |
| 7,257,458 B1 | 8/2007 | Markle |
| 7,269,925 B2 | 9/2007 | Lam |
| 8,163,631 B2 | 4/2012 | Chiang et al. |
| 8,596,312 B2 * | 12/2013 | Natsume et al. ................. 141/98 |
| 2002/0020751 A1 | 2/2002 | Matsumoto |
| 2002/0025244 A1 | 2/2002 | Kim |
| 2002/0088543 A1 | 7/2002 | Ashjaee et al. |
| 2002/0129707 A1 | 9/2002 | Tanaka et al. |
| 2002/0143656 A1 | 10/2002 | Matsuo et al. |
| 2002/0197136 A1 | 12/2002 | Huang et al. |
| 2003/0031538 A1 * | 2/2003 | Weaver ...................... 414/217.1 |
| 2003/0053894 A1 * | 3/2003 | Matsumoto ................... 414/217 |
| 2003/0082030 A1 | 5/2003 | Puerto et al. |
| 2003/0091410 A1 | 5/2003 | Larson et al. |
| 2003/0101938 A1 | 6/2003 | Ronsse et al. |
| 2003/0129045 A1 * | 7/2003 | Bonora et al. ................. 414/217 |
| 2003/0198541 A1 * | 10/2003 | Davis et al. ................... 414/217 |
| 2003/0202866 A1 * | 10/2003 | Weng et al. ................ 414/217.1 |
| 2003/0230031 A1 | 12/2003 | Lam |
| 2004/0006544 A1 | 1/2004 | Gulett |
| 2004/0047714 A1 | 3/2004 | Poli et al. |
| 2004/0062627 A1 * | 4/2004 | Aggarwal et al. ............. 414/217 |
| 2004/0081546 A1 * | 4/2004 | Elliott et al. ................... 414/805 |
| 2004/0094087 A1 * | 5/2004 | Ivanov et al. ................. 118/300 |
| 2004/0157463 A1 | 8/2004 | Jones |
| 2004/0187451 A1 | 9/2004 | Suzuki et al. |
| 2004/0207836 A1 | 10/2004 | Chhibber et al. |
| 2004/0225462 A1 | 11/2004 | Renken et al. |
| 2004/0226510 A1 | 11/2004 | Hanson et al. |
| 2004/0250762 A1 | 12/2004 | Shigetomi et al. |
| 2005/0005957 A1 | 1/2005 | Yamagata et al. |
| 2005/0014370 A1 | 1/2005 | Jones |
| 2006/0099054 A1 * | 5/2006 | Friedman et al. ............. 414/217 |
| 2006/0213842 A1 * | 9/2006 | Shani et al. ....................... 211/1 |
| 2007/0046284 A1 | 3/2007 | Renken et al. |
| 2008/0089765 A1 | 4/2008 | Moriya et al. |
| 2011/0245964 A1 | 10/2011 | Sullivan et al. |

* cited by examiner

APPARATUS TO SUPPORT A CLEANSPACE FABRICATOR

CROSS REFERENCE TO RELATED APPLICATIONS

This application claims priority to the Provisional Application, Ser. No. 60/596,343, filed Sep. 18, 2005 and entitled: Specialized Methods for Substrate Processing for a Clean Space Where Processing Tools are Vertically Oriented; and also Provisional Application, Ser. No. 60/596,173, filed Sep. 6, 2005 and entitled: "Method and Apparatus for Substrate Handling for a Clean Space where processing tools are reversibly removable"; and also Provisional Application, Ser. No. 60/596,099, filed Aug. 31, 2005 and entitled: "Method and Apparatus for a Single Substrate Carrier For Semiconductor Processing; and also Provisional Application, Ser. No. 60/596,053 filed Aug. 26, 2005 and entitled: "Method and Apparatus for an Elevator System for Tooling and Personnel for a Multilevel Cleanspace/Fabricator"; and also Provisional Application, Ser. No. 60/596,035 filed Aug. 25, 2005 and entitled: "Method and Apparatus for a Tool Chassis Support System for Simplified, Integrated and Reversible Installation of Process Tooling"; and also Provisional Application, Ser. No. 60/595,935 filed Aug. 18, 2005, and entitled: "Method and Apparatus for the Integrated, Flexible and Easily Reversible Connection of Utilities, Chemicals and Gasses to Process Tooling. The contents of each are relied upon and incorporated by reference.

FIELD OF THE INVENTION

The present invention relates to apparatus and methods which support fabricators with routinely replaceable processing tools and one or more cleanspaces.

BACKGROUND OF THE INVENTION

A known approach to cleanspace-assisted fabrication of materials such as semi-conductor substrates, is to assemble a manufacturing facility as a "cleanroom." In such cleanrooms, processing tools are arranged to provide aisle space for human operators or automation equipment. Exemplary cleanroom design is described in: "Cleanroom Design, Second Edition," edited by W. Whyte, published by John Wiley & Sons, 1999, ISBN 0-471-94204-9, (herein after referred to as "the Whyte text".

Cleanroom design has evolved over time to include locating processing stations within clean hoods. Vertical unidirectional air flow can be directed through a raised floor, with separate cores for the tools and aisles. It is also known to have specialized mini-environments which surround only a processing tool for added space cleanliness. Another known approach includes the "ballroom" approach, wherein tools, operators and automation all reside in the same cleanroom.

Evolutionary improvements have enabled higher yields and the production of devices with smaller geometries. However, known cleanroom design has disadvantages and limitations.

For example, as the size of tools has increased and the dimensions of cleanrooms have increased, the volume of cleanspace that is controlled has concomitantly increased. As a result, the cost of building the cleanspace, and the cost of maintaining the cleanliness of such cleanspace, has increased considerably.

Tool installation in a cleanroom can be difficult. The initial "fit up" of a "fab" with tools, when the floor space is relatively empty, can be relatively straight forward. However, as tools are put in place and a fab begins to process substrates, it can become increasingly difficult and disruptive of job flow, to either place new tools or remove old ones. It would be desirable therefore to reduce installation difficulties attendant to dense tool placement while still maintaining such density, since denser tool placement otherwise affords substantial economic advantages relating to cleanroom construction and maintenance.

Another area of evolutionary improvement has come with improvements in robotics. Substrate processing has changed from a manually intensive process where human operators handled substrates or batches of substrates. In current cleanroom designs, many processing tools include robotics for substrate handling. In some fabricator settings, human interaction is reduced to: loading collections of substrates onto processing tools, unloading collections of substrates from processing tools and moving collections of substrates from one processing tool to another. Evolutionary advances have transitioned into cleanroom robotics which are extremely complex and therefore costly and error prone.

In some cases, in a modern semiconductor fabricator, substrates move from tool to tool in specialized carriers which contain multiple substrates. The carriers interface with appropriate automation to allow for movement of the substrates around the fab and for loading and unloading the substrates from a processing tool.

The size of substrate has increased over time as have the typical sizes of fabs. The increased size allows for economies of scale in production, but also creates economic barriers to development and new entries into the industry. A similar factor is that the processing of substrates is coordinated and controlled by batching up a number of substrates into a single processing lot. A single lot can include, for example, 25 substrates. Accordingly, known carriers are sized to typically accommodate the largest size lot that is processed in a fab.

It would be desirable to have manufacturing facilities for cleanspace-assisted fabrication, that use less cleanspace area, permit dense tool placement while maintaining ease of installation, which permit the use of more simple robotics and which are capable of efficiently processing a single substrate.

SUMMARY OF THE INVENTION

Accordingly, the present invention provides support mechanisms for a fabrication environment that includes a cleanspace with a boundary wall and a plurality of processing tools, each having a port and a body. The processing tools can be placed with each port inside the first cleanspace and the body of each processing tool can be placed at a location peripheral to the cleanspace boundary wall, such that at least a portion of the tool body is outside the cleanspace. In addition, a single material, such as a single substrate wafer, can be processed by at least two of the plurality of tools and individually transferred from a first tool to a second tool within the integrity of the cleanspace.

The present invention can therefore include methods and apparatus for: supporting processing tools, supplying utilities to the processing tools, handling material to be processed within the cleanspace; transporting materials within the cleanspace and placing a processing tool into and out of physical communication with the cleanspace.

One general aspect includes apparatus for positioning a fabrication tool including a tool body and a tool port in a fabrication facility including a clean space; the apparatus including: a chassis supporting a base plate for mounting a fabrication tool onto; said chassis including an extended position and an operating position; a base plate attached to the chassis; said base plate including a mating surface for receiving the tool body; a fixed plate for positioning the base plate in the closed position; where when the chassis is in the operating position, the tool port is sealed within a primary cleanspace and the tool body is exterior to the primary cleanspace.

Implementations may include one or more of the following features. The apparatus where the mating surface includes tabs protruding from the surface, where the tabs are functional for aligning a tool body received thereon. The apparatus where the tabs are additionally operative for providing electrical connection for one or more of: electrical power and data signal to terminals including the tool body. The apparatus additionally including a flange portion operative to connect utility conduits to the fabrication tool, said utility conduits including one or more of: chemical gas supply, liquid supply, electric power supply and data signal connection. The apparatus where the flange includes multiple primary sealing surfaces, each primary sealing surface for supply of a discrete utility service. The apparatus where the flange additionally includes one or more secondary sealing surfaces operative to seal any gas or liquid leaking from a primary seal from entering an ambient atmosphere. The apparatus where the flange additionally includes a circular rubber seal. The apparatus where the flange additionally includes a channel for maintaining a negative atmospheric pressure around a seal containing a gas, said negative atmospheric pressure operative to evacuate any gas leaking from the seal. The apparatus additionally including a rail on which the base plate can slide from the extended position to the operating position. The apparatus additionally including a motor linked to the base plate for sliding the base plate from the extended position to the operating position. The apparatus additionally including automation for transporting a substrate from a first tool port mounted on a base plate attached to a first chassis to a second tool port mounted on a second base plate attached to a second chassis. The apparatus additionally including electronic circuits operative to track the location of a substrate. The apparatus additionally including electronic circuits operative to track the identity of multiple tools and a status of the multiple tools tracked. The substrate carrier additionally including: a main region formed by two interior walls; a first exterior region and a second exterior region; a spring mechanism within both the first exterior region and the second exterior region, said springs operative to lift the top plate and provide access to a substrate contained within the carrier. The substrate carrier additionally including: sensors operative to determine one or more environmental conditions within the interior space, apparatus capable of changing one or more of: the temperature within the interior space and the humidity within the interior space, and electronic circuits for receiving data including a temperature and humidity setting and controlling the apparatus capable of changing one or more of: the temperature within the interior space and the humidity within the interior space in order to maintain the temperature and humidity setting. The substrate carrier additionally including at least one of: a bar code identification symbol and a radio frequency identification tag, including an identification of the carrier. The flange additionally including: a contiguous channel circumventing the aggregate connection points, a channel seal atmospherically sealing an interior area defined by the contiguous channel, a fixture for connecting a vacuum source to the channel, and electronic sensors operative to monitor one or more gases leaking from the multiple sealing surfaces. The flange additionally including: a contiguous channel circumventing the aggregate connection points, a channel seal fluidly sealing an interior area defined by the contiguous channel, a fixture for connecting a vacuum source acting as a fluid trap to the channel, and electronic sensors operative to monitor one or more fluids leaking from the multiple sealing surfaces.

One general aspect includes a substrate carrier for containment of a single substrate in an isolated cleanspace environment, the substrate carrier including: a top plate; a bottom plate; at least one side sealably attached to the top plate and the bottom plate to form an interior space and contain an atmosphere within the interior space; multiple rails operative to support a substrate contained within the carrier; sloped guides proximate to the rails positioned to guide a substrate onto the rails during loading of a substrate into the carrier; and electronic circuitry for communicating electronic data with a fabrication unit.

Implementations may include one or more of the following features. The substrate carrier additionally including: a main region formed by two interior walls; a first exterior region and a second exterior region; a spring mechanism within both the thirst exterior region and the second exterior region, said springs operative to lift the top plate and provide access to a substrate contained within the carrier. The substrate carrier additionally including: sensors operative to determine one or more environmental conditions within the interior space, apparatus capable of changing one or more of: the temperature within the interior space and the humidity within the interior space, and electronic circuits for receiving data including a temperature and humidity setting and controlling the apparatus capable of changing one or more of: the temperature within the interior space and the humidity within the interior space in order to maintain the temperature and humidity setting. The substrate carrier additionally including at least one of: a bar code identification symbol and a radio frequency identification tag, including an identification of the carrier. The flange additionally including: a contiguous channel circumventing the aggregate connection points, a channel seal atmospherically sealing an interior area defined by the contiguous channel, a fixture for connecting a vacuum source to the channel, and electronic sensors operative to monitor one or more gases leaking from the multiple sealing surfaces. The flange additionally including: a contiguous channel circumventing the aggregate connection points, a channel seal fluidly sealing an interior area defined by the contiguous channel, a fixture for connecting a vacuum source acting as a fluid trap to the channel, and electronic sensors operative to monitor one or more fluids leaking from the multiple sealing surfaces.

One general aspect includes a flange for connecting a fabrication tool mounted to a base plate on a movable chassis to a fabrication clean space, the flange including: a first sealing surface connected to multiple conduits, with a primary connection point for each conduit formed in the first sealing surface; a second sealing surface with multiple secondary connection points each secondary connection point positioned to interface with a respective primary connection point; an o-ring sealably attached to each primary connection point; a generally circular area formed about each secondary connection point for sealably receiving the respective o-rings when the first sealing surface is brought proximate to the second sealing surface; and a fastener for holding the first sealing surface proximate to the second sealing surface.

Implementations may include one or more of the following features. The flange additionally including: a contiguous channel circumventing the aggregate connection points, a channel seal atmospherically sealing an interior area defined by the contiguous channel, a fixture for connecting a vacuum source to the channel, and electronic sensors operative to monitor one or more gases leaking from the multiple sealing surfaces. The flange additionally including: a contiguous channel circumventing the aggregate connection points, a channel seal fluidly sealing an interior area defined by the contiguous channel, a fixture for connecting a vacuum source acting as a fluid trap to the channel, and electronic sensors operative to monitor one or more fluids leaking from the multiple sealing surfaces.

BRIEF DESCRIPTION OF THE DRAWINGS

The accompanying drawings, that are incorporated in and constitute a part of this specification, illustrate several embodiments of the invention and, together with the description, serve to explain the principles of the invention.

DETAILED DESCRIPTION OF PREFERRED EMBODIMENTS

The present invention relates to methods and apparatus to support a cleanspace environment within which a material, such as an integrated circuit substrate, can be processed. The support can include methods and apparatus which allow a portion of a tool used to process the material to be accessible from within a cleanspace in which the material is processed. An additional portion of the processing tool can remain outside of the cleanspace environment in which the material is processed. In addition, the present invention provides for methods and apparatus to facilitate installation, removal and maintenance of the tools used to process the material.

Reference will now be made in detail to different aspects of some preferred embodiments of the invention, examples of which are illustrated in the accompanying drawings. Wherever possible, the same reference numbers will be used throughout the drawings to refer to the same or like parts. A Glossary of Selected Terms is included at the end of this Detailed Description.

Traditionally, when installing a processing tool into a semiconductor fabricator, riggers had to place the tool in a designated position where the tool remained in place for its entire time in the fab. The present invention provides for an alternative strategy wherein processing tools can be routinely placed and removed from a fab location.

One aspect of the present invention therefore provides for support fixtures which facilitate efficient placement, removal and replacement of a processing tool in a predefined location. Predefined tool placement in turn facilitates predefined locations for utility interconnections and predefined locations for material transfer into and out of associated tool ports. In some embodiments, a support fixture can further provide a chassis capable of receiving a processing tool and moving a processing tool from a position external to a cleanspace to a operational location wherein at least an associated processing tool port is located inside the cleanspace environment. In some respects, movement of the tool from an installation position to an operational position can be envisioned much like a cabinet drawer moving from an outward position to a closed position.

Other aspects of some embodiments of the present invention include the connection of support items for proper operation of the processing tool. For example, electrical supplies, chemicals, gases, compressed air or other processing tool support can be passed through the tool chassis support system via flexible connections. Furthermore, wired or wireless transfer of data could be supported by the chassis body. In addition, in some embodiments, a support chassis according to the present invention can include communication interfaces with safety systems to provide safe operation and safe removal and replacement.

Figure 1:
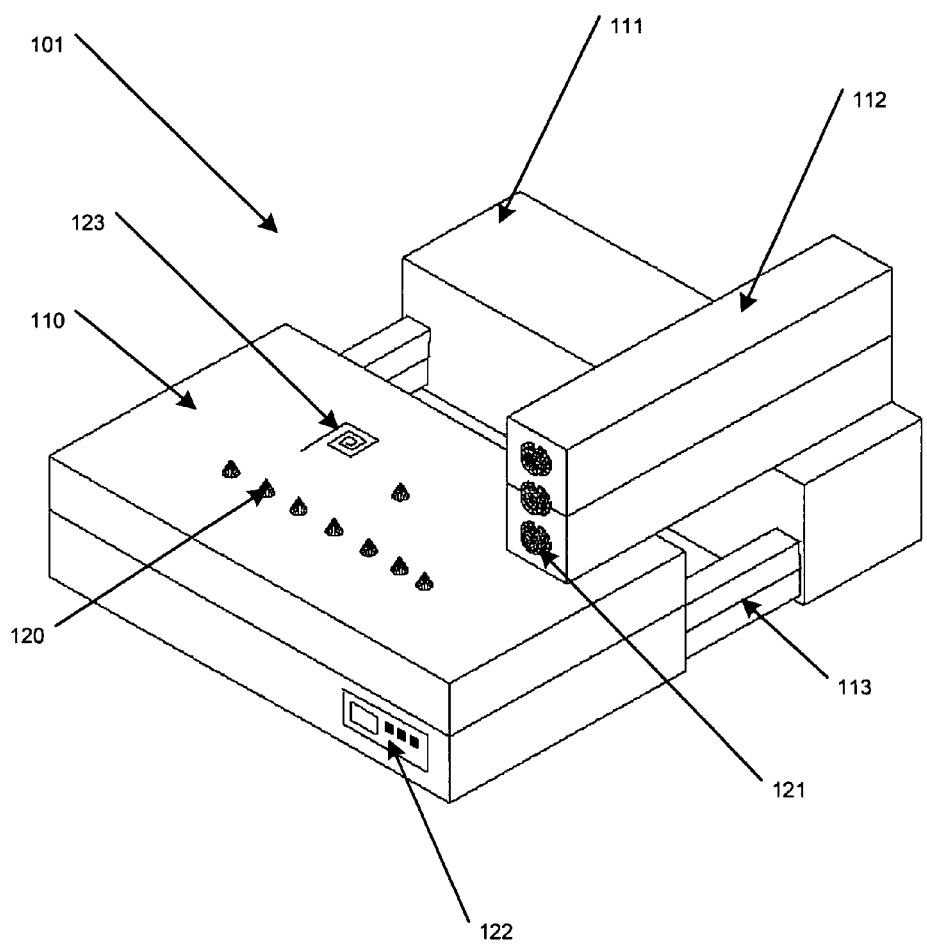
FIG. 1 Overview of Chassis Embodiment
FIG. 2 Front View with Tool Body Placed
FIG. 3 Rear View with Tool Body Placed
FIG. 4 Example Placement in an Example Fab Design
FIG. 5 Overview of Chassis—Not Extended

Referring now to FIG. 1 a chassis 101 for tools is illustrated according to some embodiments of the present invention. The chassis plate 110 and the base plate 111 are attached to a sliding rail system 113 and provide an installation location for a processing tool body (not illustrated). Base plate 111 is physically fixed in an appropriate location of a fabricator. In some embodiments, base plate 111 would not interact directly with the tool body, however, in some embodiments, a tool body can be fixedly attached to the base plate 111. In both embodiments, chassis plate 110 can physically support a tool body mounted on the chassis 101.

In FIG. 1, the orientation of two plates, chassis plate 110 and base plate 111 is shown with the plates separated. The chassis 101, can have multiple service location orientations. A first location, as shown in the drawing, can involve an extended location, such that the placement and removal of a tool body from the chassis plate 110 can occur in an exposed location. An exposed location, for example, can facilitate placement of a new tool onto the chassis plate 110. A second service location allows the chassis 101 to relocate such that both chassis plate 110 and base plate 111 are close together. An illustration of an exemplary second service location is provided in FIG. 5 including chassis plate 110 and base plate 111.

In some embodiments, tabs 120 may stick out of the chassis plate 110. The tabs 120 may serve one or more purposes. As a physical extension, the tabs 120 will have a corresponding indentation (not illustrated) in the mating plate or a surface of a tool body 201 to be placed on the tabs 120. As the tool body 201 is lowered over the chassis plate 110, the tool body 201 will reach a location as defined by tabs 120. In some embodiments, the tabs 120 can additionally provide electrical connection between the chassis plate 110 and the tool body 201. Electrical connection can serve one or more of the purposes of: electrical power and electrical data signal.

In some embodiments, a wireless interface 123 can provide wireless electrical connection between the tool body and the chassis. The wireless interface 123 can be redundant to hardwire data connections or take the place of hardwire data connection. The wireless interface can also be utilized for other electrical connections, as discussed for tabs 120. In some embodiments, a wireless interface 123 can provide one or both of electrical power and data communication.

Connections for non electrical utilities can also be provided, as discussed more fully below in the section entitled Utility Flange Connectors. Facilities connections 121 can be used for defining a connection, for example, of one or more of: gas, vacuum, fluids waste lines, compresses air, deionized water, chemicals and the like. A variety of conduits 112 can carry these utilities to the facilities connections 121 and be routed, for example, through the chassis 101. The conduits 112 can be connected to appropriate facility supply systems, air flow systems and drains to provide for safe operation.

Figure 2:
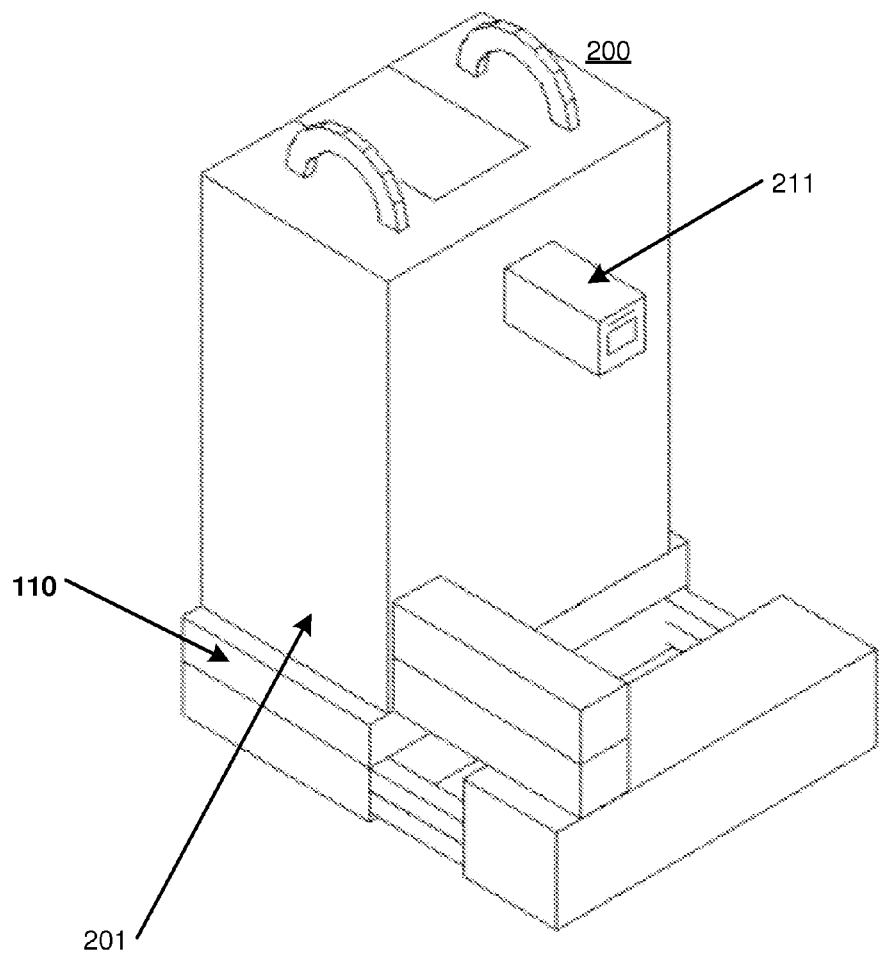

Referring now to FIG. 2, a tool body 201 can be placed onto the chassis plate 110. The tool body 201 is illustrated in a generic box, however, any type of processing tool, such as those required for semiconductor manufacture, is within the scope of the invention. In some embodiments, the underside of a tool body 201 can include a mating plate which physically interfaces with a chassis plate 110.

The present invention includes apparatus to facilitate placement of tool bodies 201 in a fab and the methods for using such placement. The chassis 101 design can be capable of assuming two defined positions; one extended position places an interface plate external to the environment that the tool assumes when it is processing. This allows for easy placement and removal. The other position can be the location where the tooling sits when it is capable of processing. The exact placement of the tooling afforded by the chassis 101 allows for more rational interconnection to facilities and utilities and also for the interfacing of the tool body 201 with fab automation. The chassis 101 can have automated operations capabilities that interfaces with the tool body and the fab operation to ensure safe controlled operation.

In another aspect of the invention, a processing tool 200 can transfer a material, such as, for example, a semiconductor substrate, in and out of a tool body 201. In FIG. 2, a tool port 211 can be used for coordinating transfer of a material into and out of the tool port 211 and maintaining cleanspace integrity of a tool body 201 interior. As can be seen in FIG. 2 this embodiment contemplates placing the tool port 211 in a manner physically connected to the tool body 201. A further purpose of the movement of the chassis plate 110 from its extended position to its closed position, which may also be referred to as its operating position or operational position, would be the movement of the tool port 211 through an opening in a clean space wall. This would allow the tool port 211 to occupy a position in a clean space so that fabricator logistics equipment can hand off wafers and carriers of wafers to the tool port 211.

Figure 3:
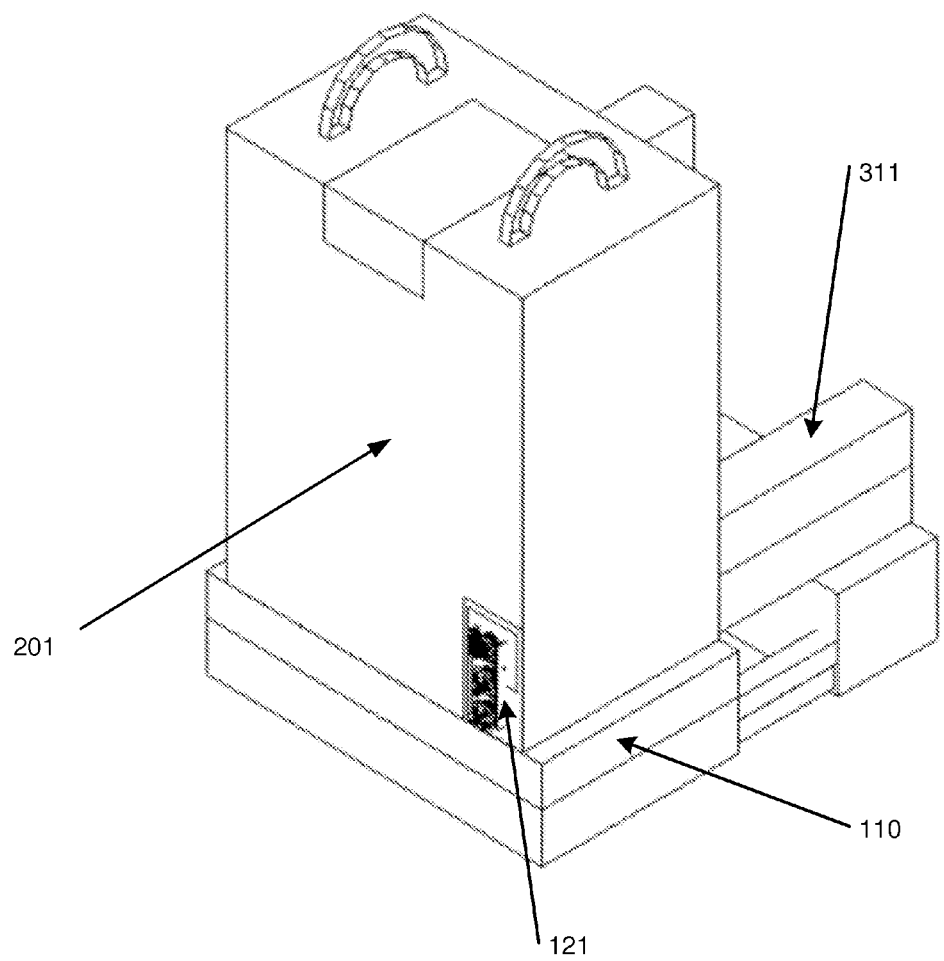
Figure 4:
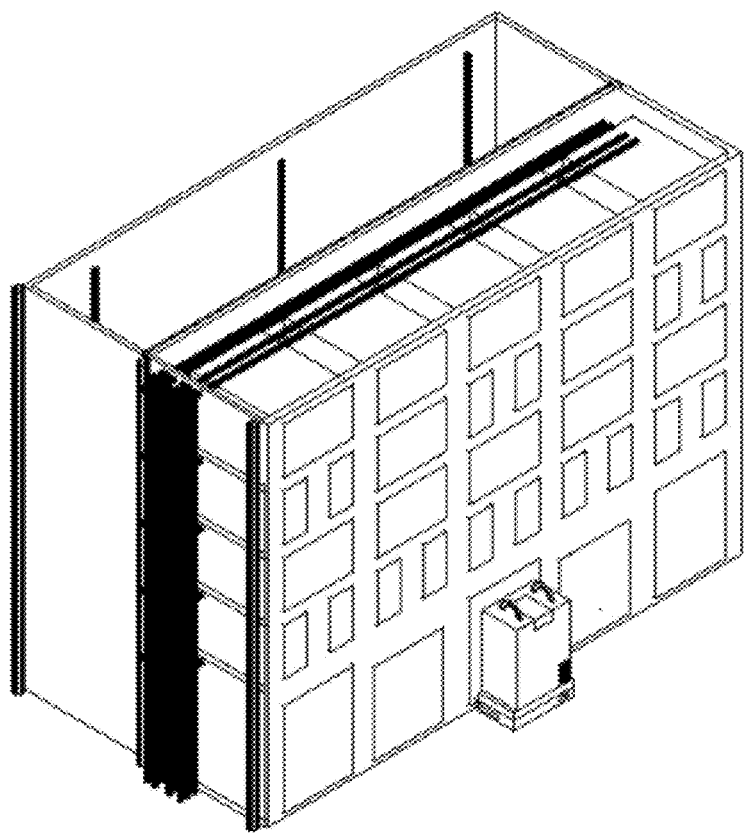
Figure 5:
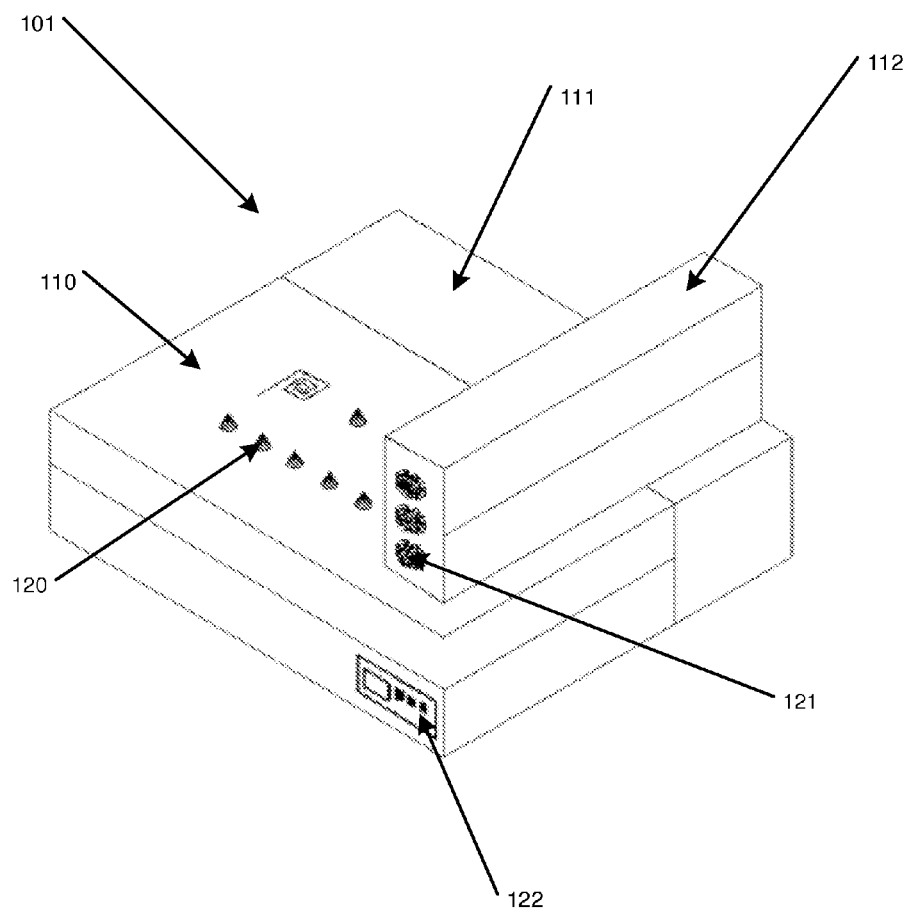

Referring now to FIG. 3, in some embodiments, a tool body 201 can include a specifically located set of mating pieces which may be called tool connections 311 for connecting the tool body 201 to facility supplied utilities. When the tool and chassis are moved from an extended position as shown in FIG. 1 to a closed position as shown in FIG. 5, such movement can place tool connections 311 in proximity to the facilities connections 121 and thereby allow for connection of various utilities. In some embodiments, as a processing tool 200 is connected, various aspects of tool automation electronics can monitor the connection and determine when the connections are in a safe operating mode. Such tool automation electronics can communicate to the tool body 201 and to the chassis plate 110 to identify a state that the connections and supply conduits are in.

In still another aspect of the invention, in some embodiments, control automation can be contained within the chassis for various aspects of the operation of the chassis 101. It is within the scope of the present invention to monitor and control multiple states related to the chassis 101 via electronic included in the chassis 101. Such states can include, by way of example, a physical location of a chassis 101 in an extended or closed state. Therefore, for example, if a processing tool 200 and chassis 101 are in a closed and operational state, a technical operator may issue a command to the chassis 101 to move to an extended location. Such communication could occur through a control panel 122 or through wireless communication to the chassis 101 through wireless interface 123. Control of the processing tools can be accomplished with any known machine controller technology, including for example a processor running executable software and generating a human readable interface.

In some embodiments, a command to move to the chassis 101 to an extended location can also initiate, amongst other algorithmic functions, a check for the status of utilities connections. It is also within the scope of this invention to require any such utility connections to be rendered into a state of disconnect before the chassis 101 can proceed to an extended position.

Similarly, in some embodiments, prior to operations such as extension of a chassis 101, processing steps can determine that a tool body 201 did not contain any substrates prior to extension of the chassis 101. It is also within the scope of the present invention for communication modes included within the chassis 101 to communicate with fab wide automation systems for purposes such as tracking the location of substrates; tracking the identity of tools; and tracking the status of processing tools 200. If connections to a processing tool 200 and chassis 101 are in a proper state then the chassis can move into an extended position allowing for removal of the tool body 201 and replacement with a tool body 201 of a similar type.

In some embodiments of the present invention, a fabricator will include automation to handle substrates and control their processing. And, in many cases the substrates can move from tool to tool in a specialized carrier which contain the substrates. The specialized carriers can be transported via automation which includes automated transport systems. The carriers can thereby be presented to one or more processing tool interfaces, also referred to herein as a "port". The automation allows for movement of the substrates around the fab and for loading and unloading the substrates from a processing tool. Substrates can include, for example and without limitation, wafers for semiconductor processing, microelectronic machines, nanotechnology, photonic, and biotechnological carriers.

A substrate processing tool port can support processing tools and handle wafers and wafer carriers in an environment attached to the tool body. The tool port can penetrate a clean space containment wall and the tool body can enable routine placement and replacement into the fabricator environment.

As described above, according to the present invention, processing tools reside with their tool bodies in a position which allows the tool body to be outside of a cleanspace with a tool port operatively attached to the tool body inside of the cleanspace. For example, embodiments can include a tool body adjacent to, or on the periphery of, a clean space of the fabricator and the tool port extending into the cleanspace. Each tool body can be removed and replaced in a standardized process and without requiring the removal of adjacent tool bodies. The present invention also anticipates the automated transfer of substrates from a first tool port of a first processing tool to a second tool port of a second processing tool, while maintaining the substrate in a clean space environment via a clean carrier.

Embodiments therefore include tool ports that are capable of receiving a carrier from the automated transport system. Each carrier can contain at least one substrate. The automated transport unloads the carriers and passes the carrier off to the processing tools automation systems. In some embodiments, the port size enables it to span a wall used for the definition of a primary clean space of the fabricator. Inside the primary clean space resides the entry area of the tool port. The tool port's body can span a distance in excess of the width of the clean space wall to allow for substrates which are unloaded from their carrier to be robotically handed off to the tool body's automation.

The novel tool port can incorporate various levels of automated carrier and substrate handling apparatus. For example, in some embodiments, the carrier and handling apparatus can include communication systems which receive data from electronic sensors monitoring each port, processing tools and transport apparatus. In another aspect, a substrate can be contained within a controlled ambient environment while it is within the storage carrier, port and processing tool.

Substrate Handling

Figure 6:
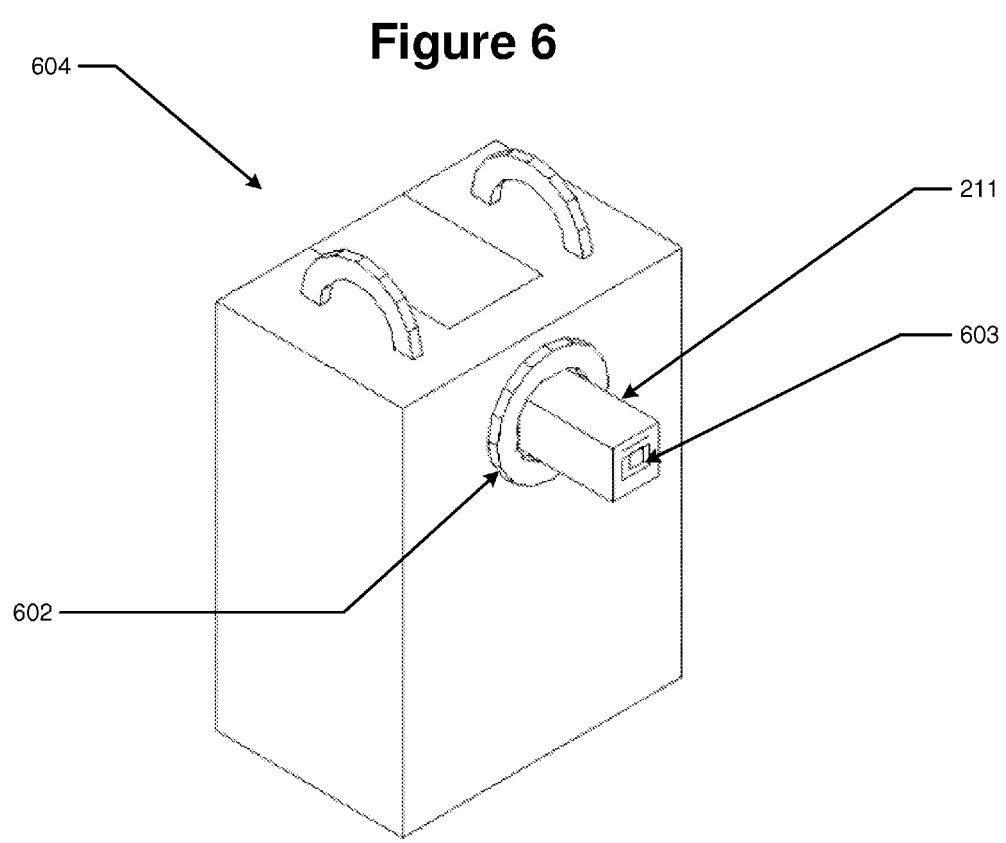
FIG. 6 illustrates an example tool body elevation view showing a substrate handler.

Referring now to FIG. 6, the present invention provides methods and apparatus for handling substrate carriers in a way that is consistent with routine placement and replacement of the processing tool body 201. A generic form of a processing tool body 201 is illustrated which contains processing equipment for processes commonly used in fabricating semiconductor devices. The processing tool body 201 is illustrated with handles to clearly indicate the ability of the processing tool body 201 to be removed from its processing position. The tool port 211 extends from the processing tool body 201. In some embodiments, the tool port 211 extends a sufficient distance to traverse an associated clean room wall and be in position for the port entry 603 or "mouth" to receive and hand off substrates.

In some embodiments, the processing tool body 201 resides in a secondary clean space which is independent of the primary clean space. Separation of the primary cleanspace and the secondary cleanspace is accomplished via a sealing mechanism 602. The sealing mechanism 602 can include, for example, a collapsible ring of material that when pushed against a sealing surface forms an atmospheric seal.

Figure 7:
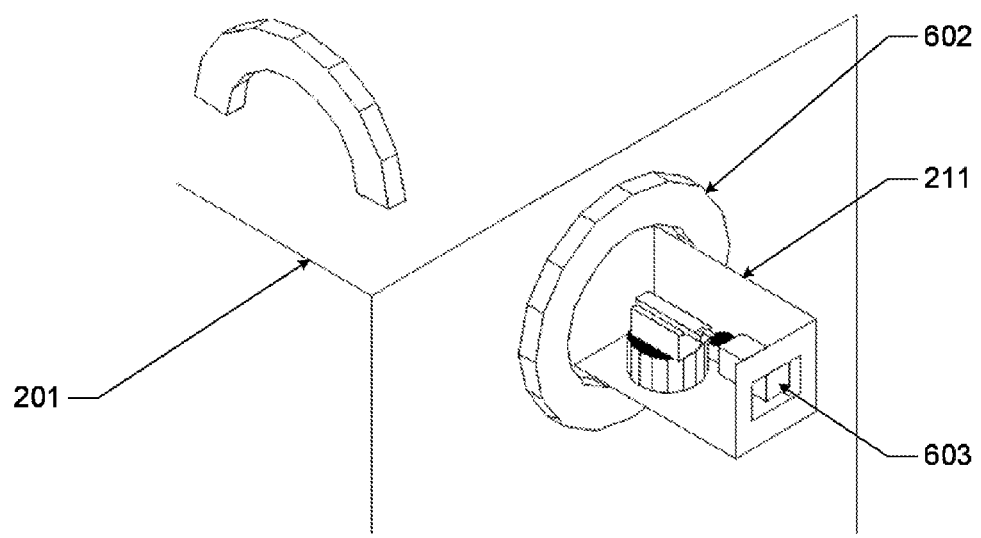
FIG. 7 illustrates a close up view of substrate handler indicating internal components in context with a tool body.

Referring now to FIG. 7, tool body 201 is shown at a closer perspective including the seal 602 around the tool port 211 and side panels around the inside removed.

Figure 8:
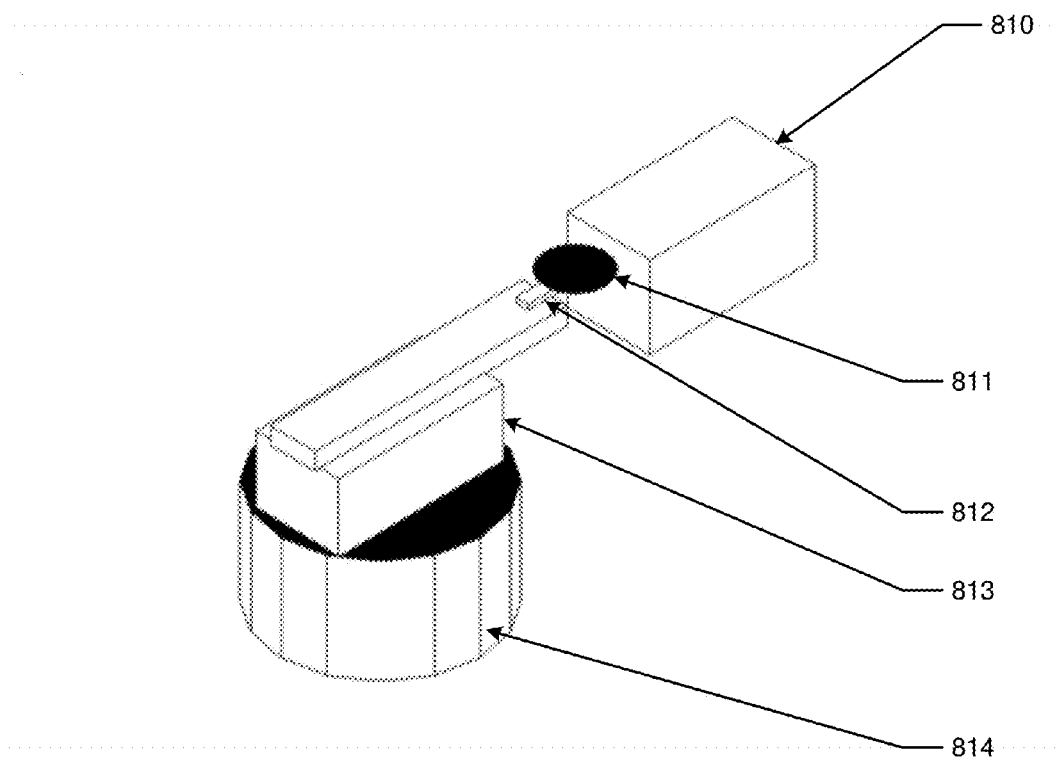
FIG. 8 Substrate Handler Internal Components.

FIG. 8 illustrates a close up of an embodiment of the internal components of a tool port 211. A cassette loading and unloading apparatus 810 is automatically operative to open a cassette (not shown) and insert or remove a substrate according to a software instruction received. A substrate 811 is illustrated being removed from the cassette loading and unloading apparatus 810. The substrate 811 is shown sitting on a holder 812, such as, for example, a vacuum actuated holder. The holder 812 is connected to a retractable handler arm 813. The retractable handler arm 813 can be operative to move the holder 812 and a substrate into and out of a cassette. A rotation stage 814 supports the retractable handler arm 813 and is capable of positioning the retractable handler arm 813 along an arcuate path.

In some exemplary embodiments, a cassette containing a substrate 811 is loaded by a fabricator automation robot into the "mouth" of a cassette loading and unloading apparatus 810. Inside the cassette loading and unloading apparatus 810, the cassette can be opened, thereby exposing a substrate 811 contained there. In some embodiments, the cassette maintains a clean space environment for the substrate 811 contained in the cassette. In addition, the environment of the unloading apparatus is also a cleanspace thereby keeping the substrate 811 in a cleanspace environment after it is unloaded.

The retractable handler arm 813 extends into the cassette and secures the substrate 811 with an actuated attachment mechanism, such as for example a vacuum tip. The retractable handler arm 813 is then retracted back out of the cassette unloader. In some embodiments, the retractable handler arm 813 centers over the rotation stage 814. A rotation of the rotation stage 814 with the arm centered would lead to the minimum amount of space required. Once the arm has rotated towards the tool body, the arm can again extend allowing the wafer to be placed in a receiving location of the processing tool body 604. After processing, the substrate 811 can be moved back to a receiving location and picked up by the holder 812. By reversing the above steps the substrate 811 can be transferred back to a carrier for handoff to the fabricator automation. The fabricator automation can transport the substrate to an additional processing tool for further processing by the additional tool.

Figure 9:
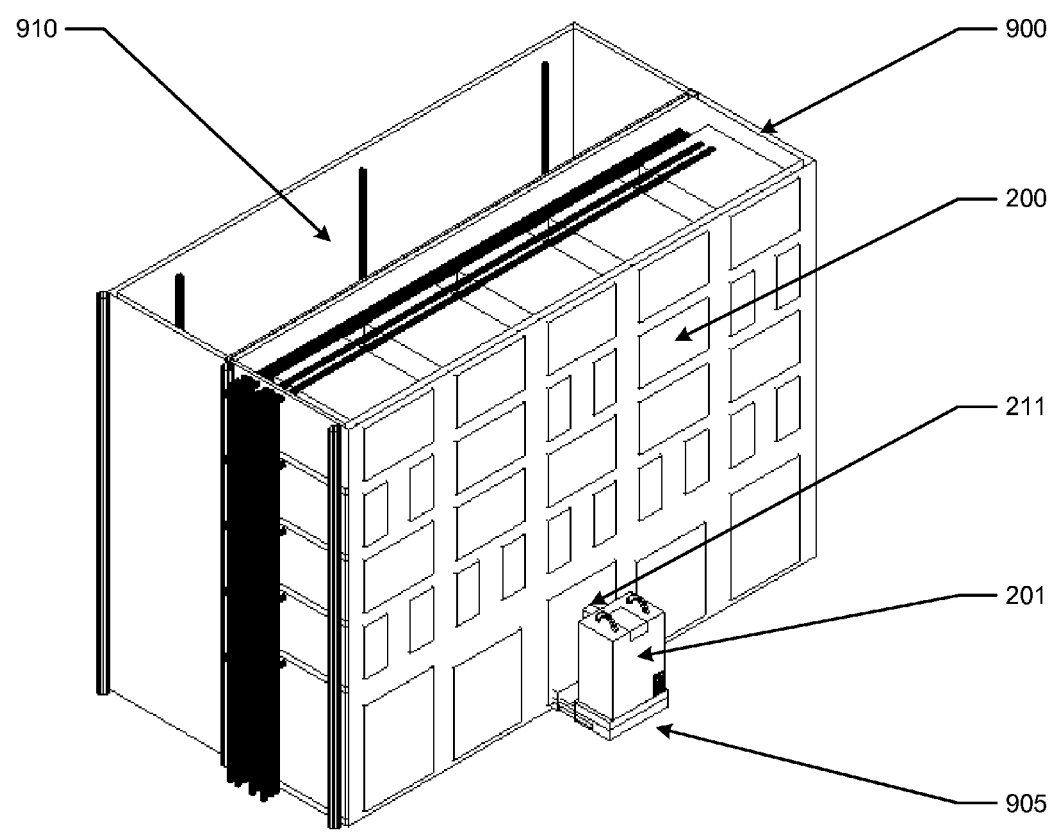
FIG. 9 illustrates a tool body with substrate handler attached to an exemplary fabricator.

FIG. 9 illustrates perspective view of how a port according to the present invention is operatively attached to a tool which is easily placed and replaced. In some embodiments, a fabricator 900 has a series of tools 200 which may be stacked. When a tool 200 is being placed or replaced it sits in a retracted position 905 relative to a normal position as illustrated by the position of tool 200 in a fabricator. The tool body, 201, is shown in its refracted position, 905. As illustrated, the tool port 211, is located on a side of the tool body 201 with the furthest edge just visible.

Figure 10:
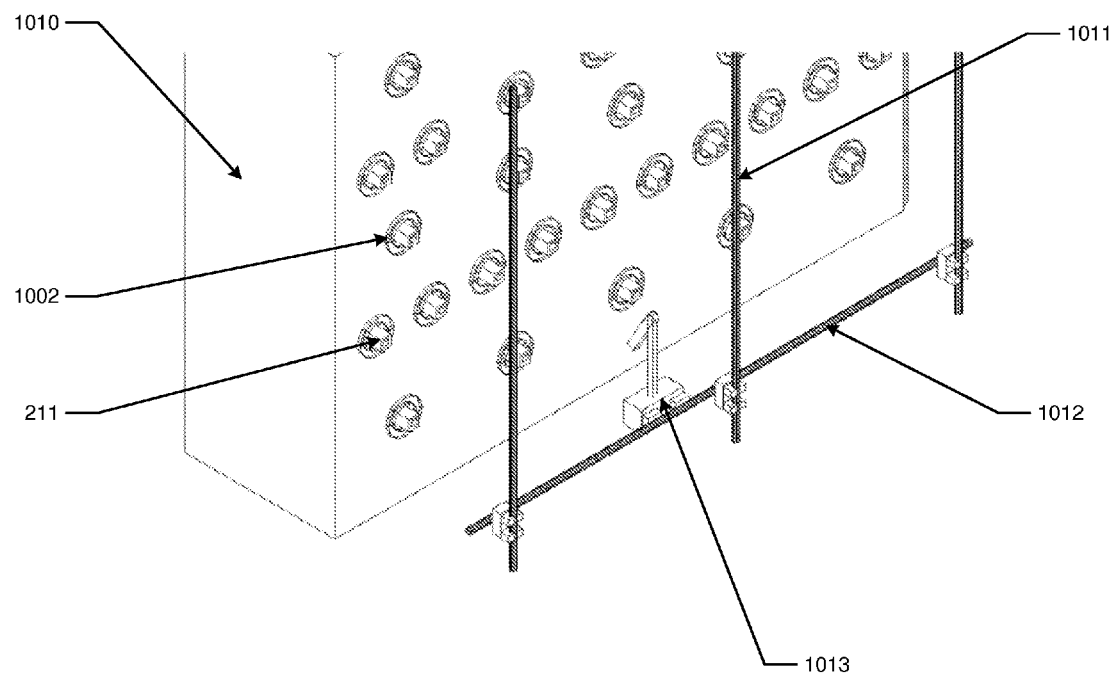
FIG. 10 illustrates a rear view plane view of an exemplary fabricator with back walls removed and thereby showing multiple tool ports and fabricator automation.

FIG. 10 shows a perspective of the fabricator 900 from the opposite side illustrated in FIG. 9. The back fabricator walls have been cut away in order to illustrate an inner portion of the fabricator 900, including multiple tool ports, such as, for example as exemplified by tool port 211. Tool port 211 is attached to a tool body 201 that is fully advanced into the fabricator and in the normal position.

According to some embodiments, while a tool body is located in the normal position, a seal is formed against the sealing surface 1002 maintaining the integrity of the cleanspace into which the tool port 211 extends. As illustrated, the tool body 201 connected to the tool port 211 extends away from the clean room wall 1010. In this position, the tool port 211 is able to interface with transport automation 1013 situated on a rail 1012. In some embodiments, a robot arm would index from the transport automation 1013 to a tool port 211 which is at a correct position by moving horizontally on rail 1012 while that rail moved along the vertical rail system 1011. Any other known transport automation can similarly be employed to position the tool port 211. When transport automation 1013 is located in a programmed position, the transport automation 1013 moves forward to hand a wafer cassette to the tool port 211.

In another aspect, the clean environment 910 of fabricator 900 and each tool port 211 can be facilitated by transporting equipment on the rail 1012 to a tool port 211 and open the tool port 211 to flow liquids or gasses over the internal surfaces of the tool port 211 in order to facilitate particulate and film cleaning.

Substrate Carrier

Another aspect of the present invention includes a carrier for containment of a single substrate in a clean environment. The carrier is capable of the transport of the single substrate inside and outside of an environment for processing substrate wafers. The single substrate carrier is capable of interfacing with processing equipment which is designed specifically for single substrate processing as contrasted with a semiconductor lot of 13 to 25 substrates. In some embodiments, the carrier can be loaded and unloaded by application of opposite force to its top and bottom plate for access to a substrate contained therein. Some embodiments can also include electronics for information, such as the identification and status of a wafer contained therein and for wired or wireless communication. Some embodiments can also include a carrier including environmental control equipment.

According to the present invention, a fabricator is provided for efficient production of lot size of a single wafer. Although designs of carriers exist to carry a single substrate at a time, these carriers are not made for the purpose of processing the substrates, but rather for transporting a wafer out of a processing line for testing, finishing or other purposes. The present invention provides methods and apparatus for a carrier of a single substrate wafer which maintains the substrate in a clean environment.

The novel single substrate processing carrier according to the present invention can incorporate various levels of automation to interface with a modern fabrication facility. For example. according to the present invention, a single substrate carrier can include electronic circuitry for communication of data from the carrier to other systems that can include, for example, processing tools and fabricator wide automation systems. Furthermore, in some embodiments, single substrate processing carrier can provide and maintain environmental control of the single substrate stored. Environmental control can include, for example, temperature and humidity control.

In another aspect, since a single substrate is the minimum entity size that can be processed at a time; a single wafer carrier according to the present invention can serve the purposes of both a processing carrier in a fabricator environment; and, a shipping carrier external to the environment. Further embodiments can also include a single substrate carrier which allows for single carrier to store a substrate in processing of the substrate, test of the substrate, as well as packaging and diagnostic environments for the substrate.

Figure 11:
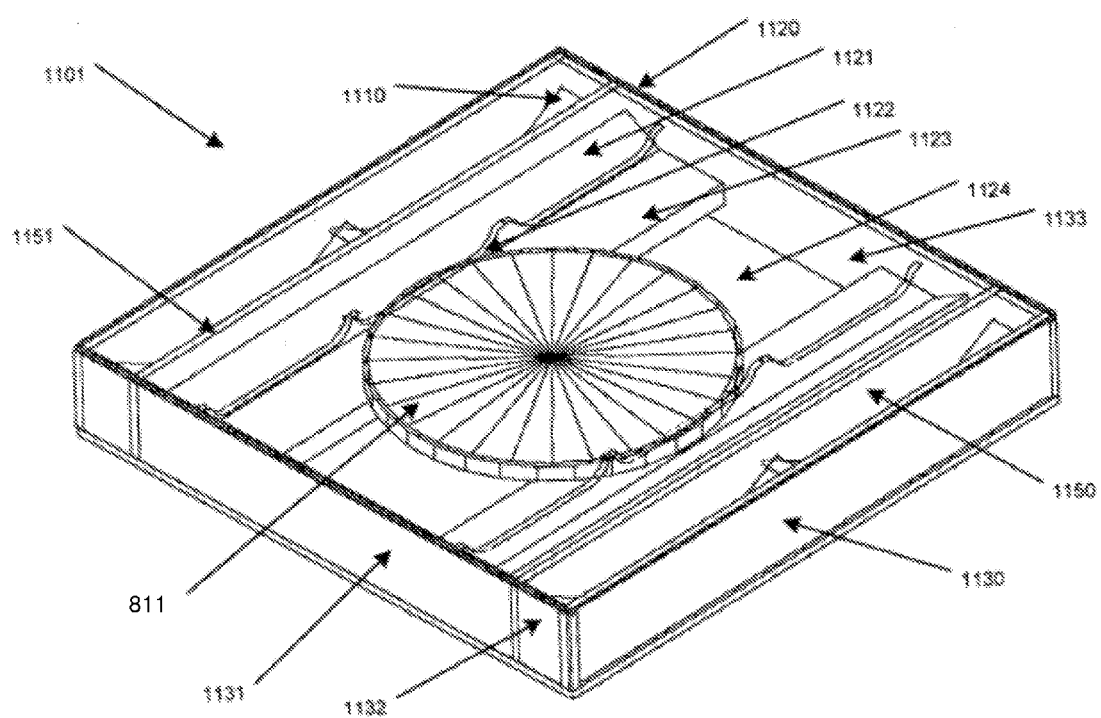
FIG. 11 illustrates a single level carrier with clips and ramped support rails.

Referring now to FIG. 11, according to the present invention, a carrier 1101 is provided which can contain a single substrate at a time and which can easily be transported to automated processing ports. In some embodiments, the carrier 1101 includes a box like shape having side panels 1130 and 1131, top plate 1120 and bottom plate 1124. In these embodiments, three box-like regions are defined. A main region where the substrate 811 is contained and two exterior regions where spring-like material forming spring 1110 is contained is shown. Other embodiments can include cylindrical or non-uniform shapes and defined regions accordingly.

According to the present invention, during containment in the carrier 1101, substrate, 811, resides in a contained clean environment; and is able to be removed and replaced from the clean environment without violating the integrity of the clean environment. Therefore, the present invention provides for an external handling unit engaging the top plate 1120 and the bottom plate 1124 and moving them apart. During such movement, the springs 1110 deflect allowing for separation of end sides 1130-1131 from an attached panel, such as the bottom plate 1124. Two lateral sides 1150 and 1151 and pieces of the other sides 1132 remain fixed to the bottom plate 1124, while side panels 1131 and 1133 remain fixed to the top plate 1120. Sealing material, such as a pliable synthetic, silicone or a foam material can border the corresponding surfaces of the top plate 1120 and bottom plate 1124 where the non attached side panels 1131, 1133 make contact.

A set of rails 1123 within the carrier 1101 can provide support for substrate 811. A set of sloped guides 1121 attached to the rails 1123 facilitate the location of the substrate by transfer automation in a fab (not shown). The force of springs 1110 can return the top plate 1120 and the bottom plate 1124 to their respective storage positions. In the storage position, the various sealing surfaces 1122 are placed in a closed position. A securing device, such as, for example, a set of clips (not illustrated) can secure the top edge of a substrate 811 placed within the carrier 1101 and hold the substrate 811 in place while it is contained within the carrier 1101.

Figure 12:
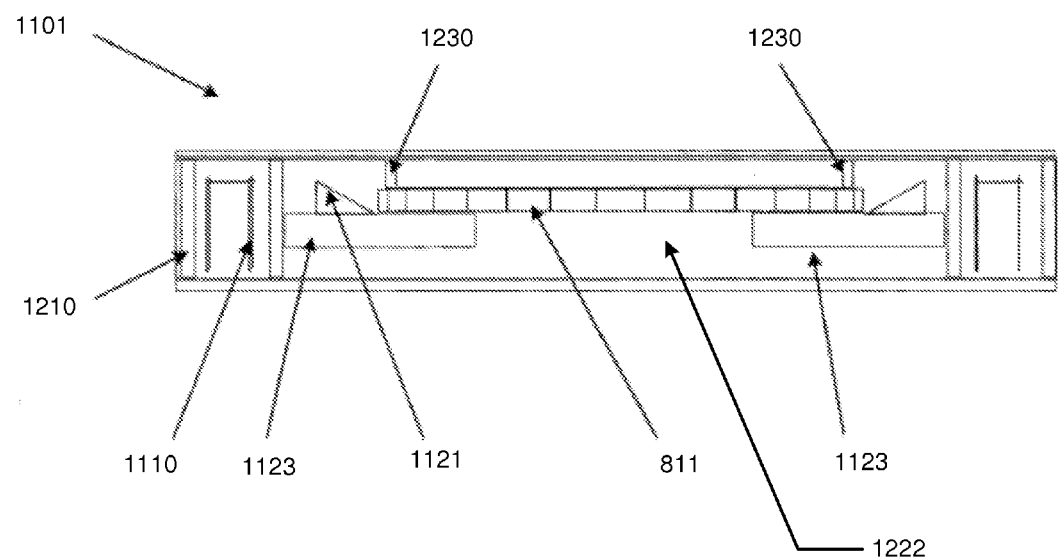
FIG. 12 illustrates aCross Section of A single level carrier with Clips and Ramped Support Rail.

Referring now to FIG. 12, a side elevation illustrates the spatial relationship of several components implementing one version of the present invention. As illustrated, a substrate 811, is supported by a set of rails 1123. Sloped guides 1121 proximate to the rails aid in locating the substrate. Channels 1210 are located separate from the substrate chamber 1222. The channels can contain springs 1110 which facilitate opening and closing of the carrier 1101. In some embodiments, clips, finger springs or other securing mechanism 1230 push down on a surface of the substrate 811, securing the substrate against the rails 1123.

Figure 13:
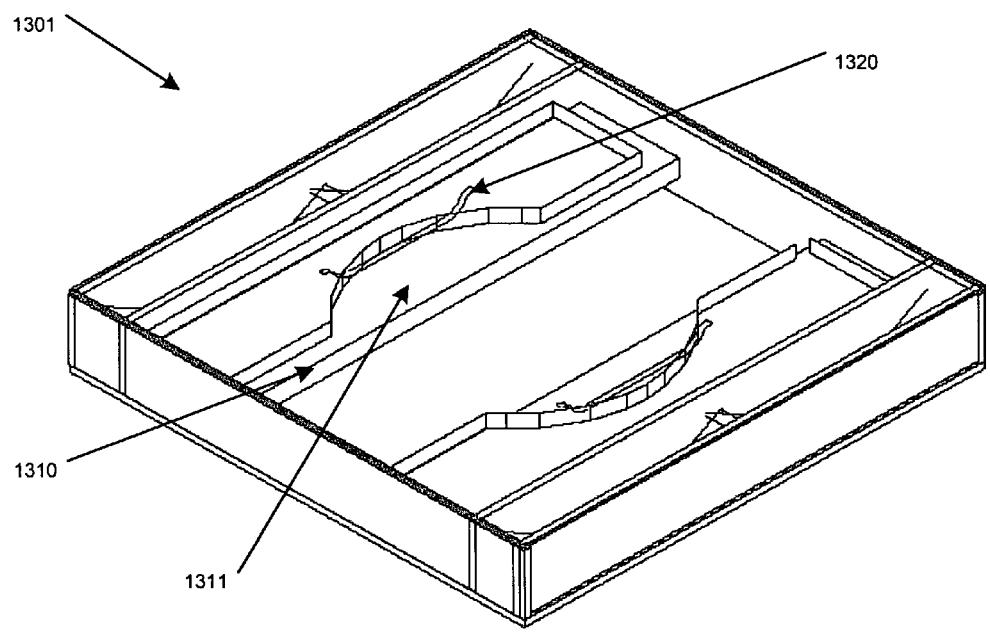
FIG. 13 illustrates a single level Carrier with a substrate shaped slot on support rails.

An alternative embodiment is shown in FIG. 13 as carrier 1301. This alternative shares substantially the features of the embodiments of FIGS. 11 and 12. However, in the embodiments illustrated in FIG. 13, a pocket 1311 roughly the same shape as the substrate (not illustrated in FIG. 13) is provided to receive the substrate. The pocket 1311 is defined as a cutout in pieces of a rail 1310 which supports the substrate away from the bottom of the carrier. Similar to the preceding examples, finger springs or clips 1320, provide force on the edge of a substrate when the carrier is in a closed configuration and secure the substrate in place against the rails 1310.

Figure 14:
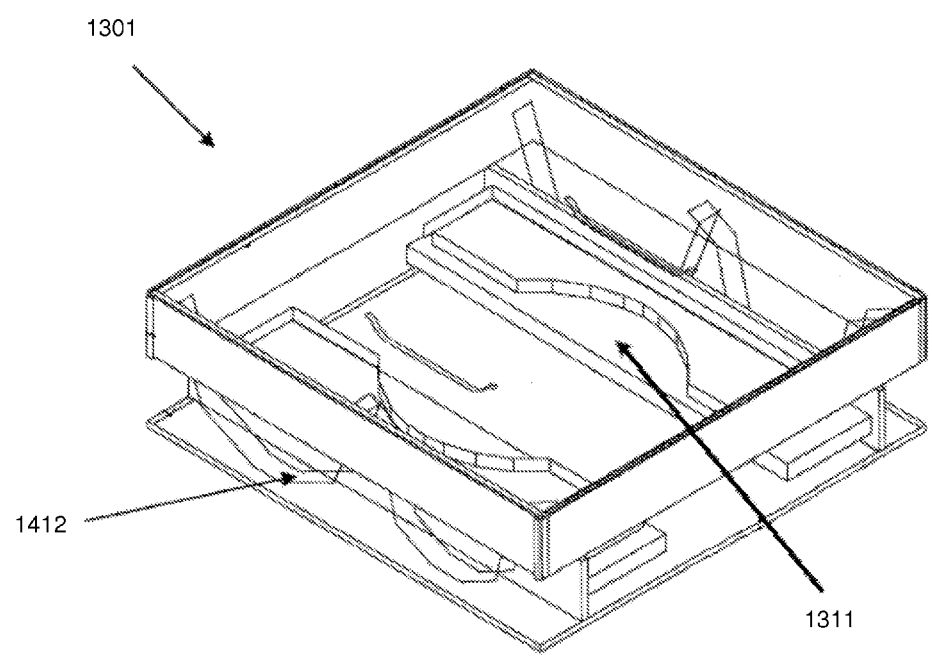
FIG. 14 illustrates an elevation of an open single level carrier with a substrate shaped slot on support rails.

FIG. 14 shows a depiction of an embodiment of a carrier 1301 with a pocket 1311 to hold the wafer in an open position. Springs 1412, are shown in an extended position with the top plate and sides of the carrier are moved away from the back plate.

Figure 15:
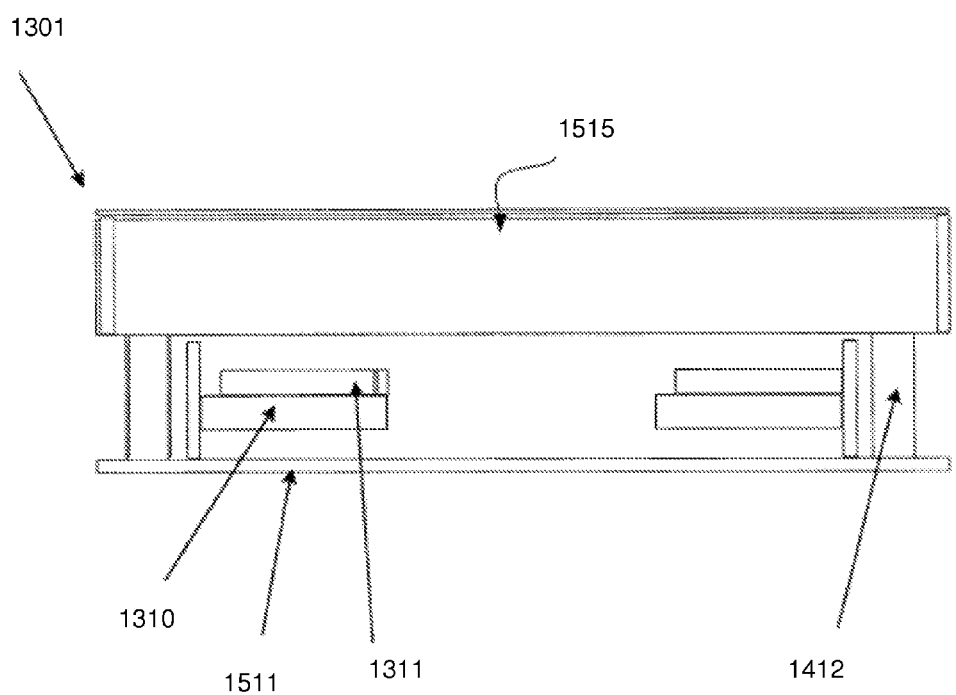
FIG. 15 illustrates a cross section of an open single level carrier with a substrate shaped slot on support rails.

FIG. 15 shows a side view of some embodiments of a carrier 1301 in an open position. The carrier 1301 can be held in the open position while a substrate (not illustrated in FIG. 15) is being moved into or out of the carrier 1301. An access path for a substrate is formed when the top plate 1515 and bottom plate 1511 are moved apart from each other.

The rails 1310 and pocket 1311 can be affixed to the bottom plate 1511 to allow a gap to be formed underneath the substrate. A handling arm can extend into the gap and removably attach to the substrate, for example by using a vacuum tip. The handling arm can lift the substrate and with horizontal movement of the arm retract out of the pocket. After retraction of arm, the carrier resumes a closed position under the action of the springs 1412.

Figure 16:
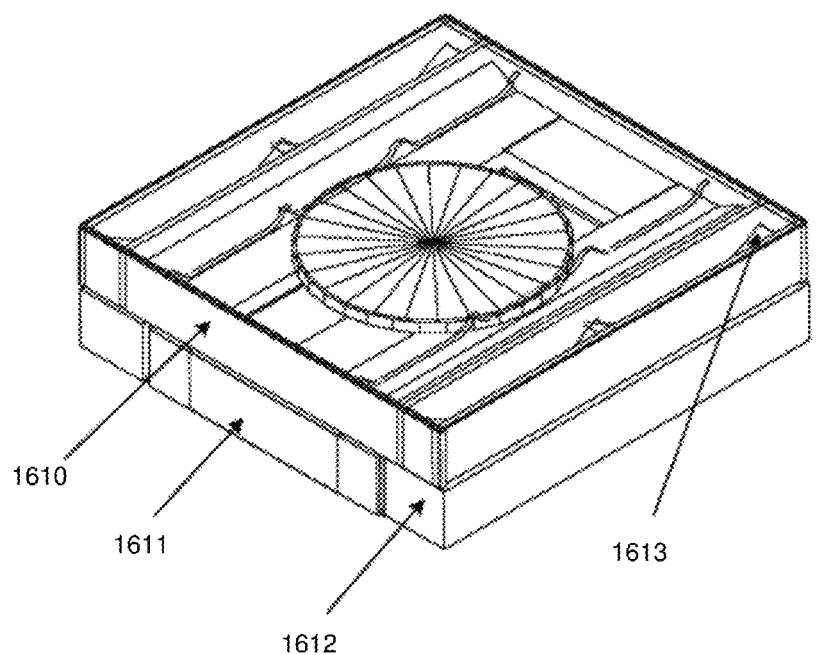
FIG. 16 illustrates an elevation of a double level carrier with clips and ramped support rails.

Referring now to FIG. 16, in some embodiments, the relative size of robotics, or other spatial considerations, may make it advantageous to utilize two levels of spring attached plates with a middle plate (not shown in this view). Springs 1613 can be seen in this case for the opening of the top level 1610. A lower level 1611 is identified that can move down, with springs that are not shown, relative to the location of a fixed plate which can be attached to a hard fixture 1612.

Figure 17:
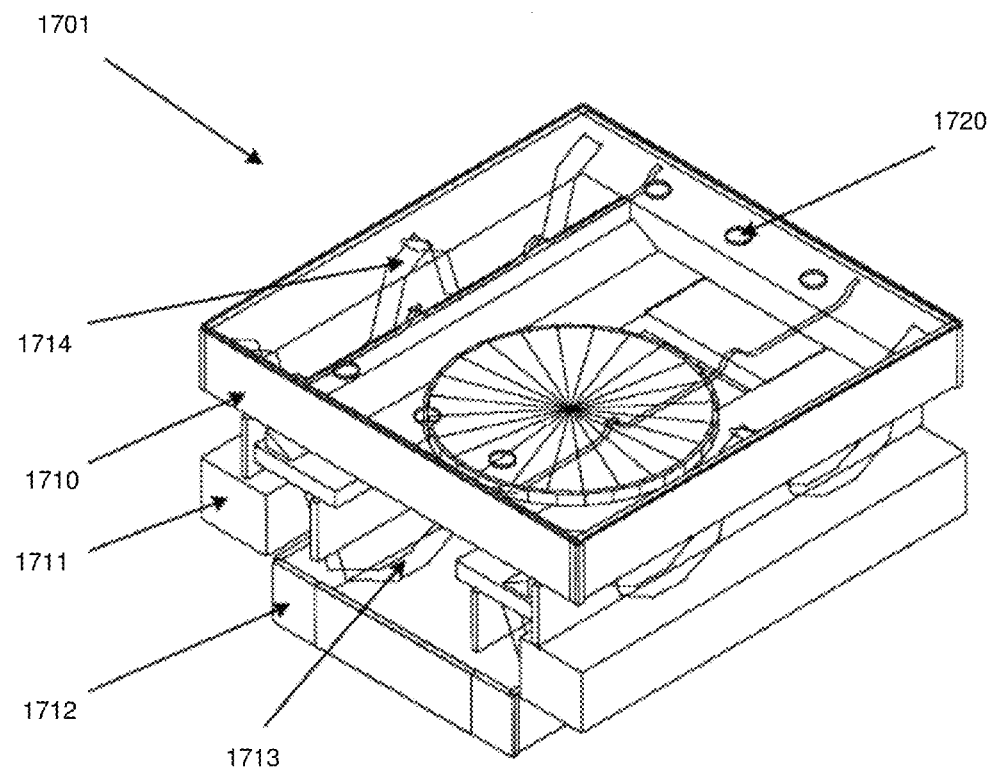
FIG. 17 illustrates an elevation of an open double level carrier with clips and ramped support rails and vent holes in top transparent panel.

Referring now to FIG. 17, a two level carrier 1701 is shown in an open position. The elevation view now makes apparent, the second level of springs 1713 used to support the bottom level 1712. The top level 1710 is held by springs 1714. The middle plate 1711 is the support surface for the substrate.

In some embodiments, an additional aspect includes a set of vent holes 1720 that are located in the top level 1710 of the carrier. The vent hole can allow for equipment to control the ambient temperature of the substrate to be attached as an integral part of the carrier.

Figure 18:
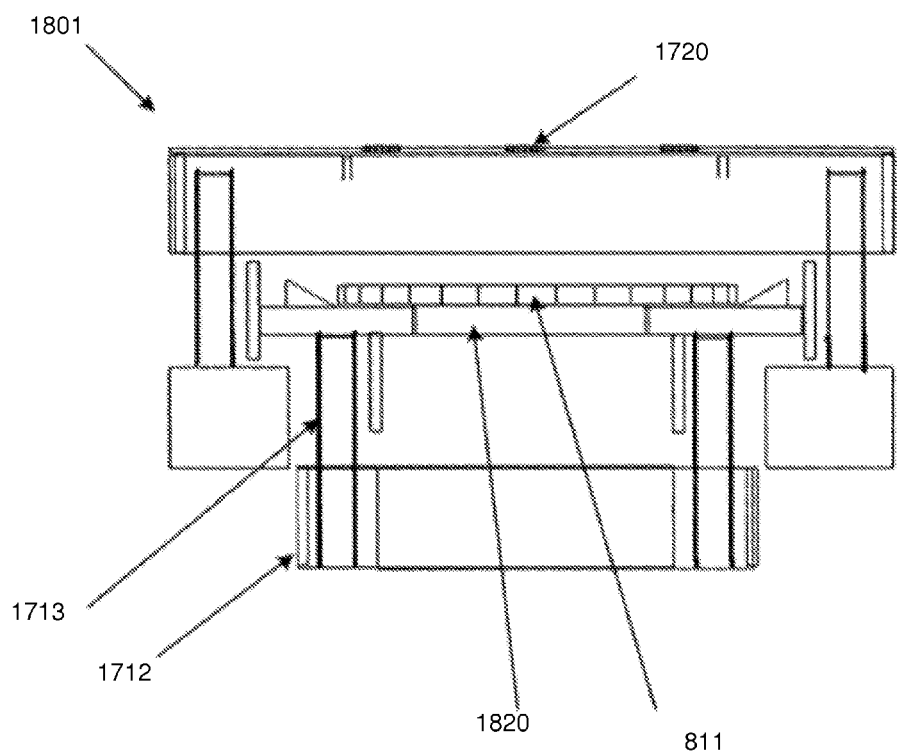
FIG. 18 illustrates a side view of an open double level carrier with clips and ramped support rails and vent holes in top transparent panel.

A side view of an open carrier 1801 is shown in FIG. 18. A gap 1820 defined as the bottom of the substrate 811 and the top of the bottom level 1712 can be much larger than that of a single level carrier due to the extra movement allowed by springs 1713. Vent holes 1720 can be placed in the top plate of the open carrier 1801. It should be noted that such vent holes can be made into the top of any of the various carrier embodiments FIGS. 11-18 in a similar fashion.

Figure 19:
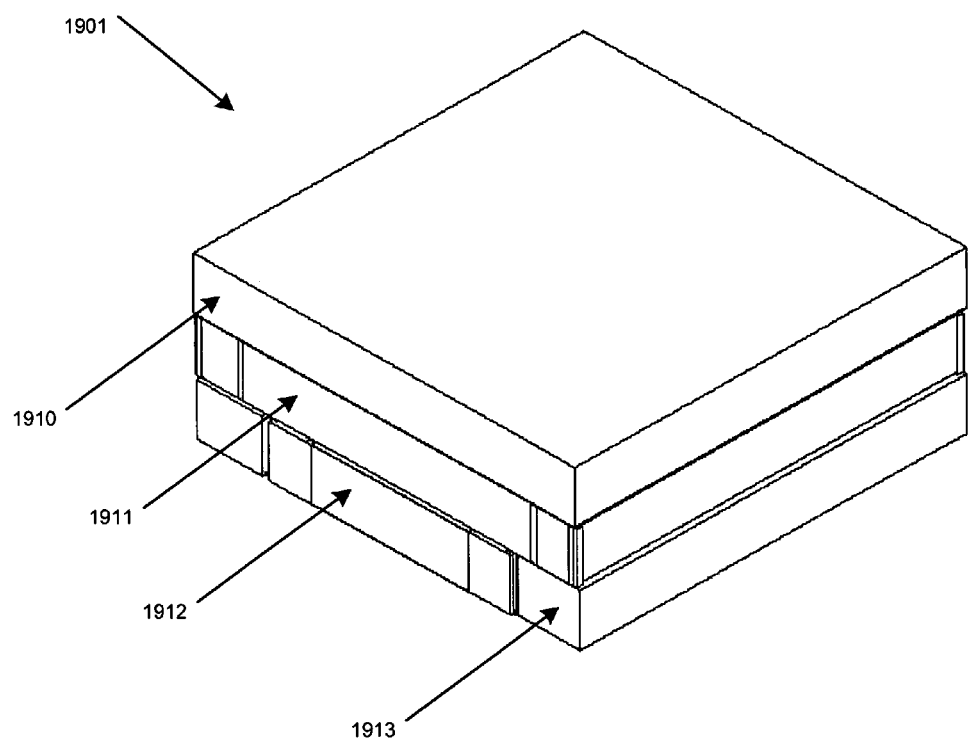
FIG. 19 illustrates an elevation of a double level carrier with vent holes in top panel and environmental control unit attached to top panel.

Referring now to FIG. 19, an elevation of a closed dual level carrier 1901 is illustrated. A bottom level, 1912 and the top level 1911 are both shown in a closed position relative to an affixed wafer and to level 1913. In some embodiments, an environmental control entity 1910 can be schematically shown attached to the top plate of the carrier. Such an environmental control entity 1910 can be operative to move airflow through one set of vent holes in the top plate, process the air, for among other factors its humidity, and then flow the air back into the carrier environment through another set of holes.

Addition of communication and power entities can also be incorporated into the various carrier designs. Specific placement of such entities is not limited, however, for the purpose of illustration the embodiments illustrated in FIG. 19 can be used for discussion. When dual level carrier 1901 is being held inside an automation piece of equipment, it can be envisioned that the components of level 1913 can be held in a fixed position by the e external automation, while moving pieces of the automation attach to appropriate parts of the top level 1911 and the lower level 1912 by vacuum for example. Channels in level 1913 can contain electronic circuitry to control, for example: wired communications, wireless communication, handling, and ambient environment conditions. In a wired sense, the parts of level 1913 in fixed contact with the handling units can determine the interface faces for such connection. Furthermore, storage batteries residing in spaces of level 1913, can also be charged up using a similar fixed contact or alternatively, power, can be transferred via electromagnetic fields from the automation equipment to receiving electronics inside the space of the carrier.

Figure 20:
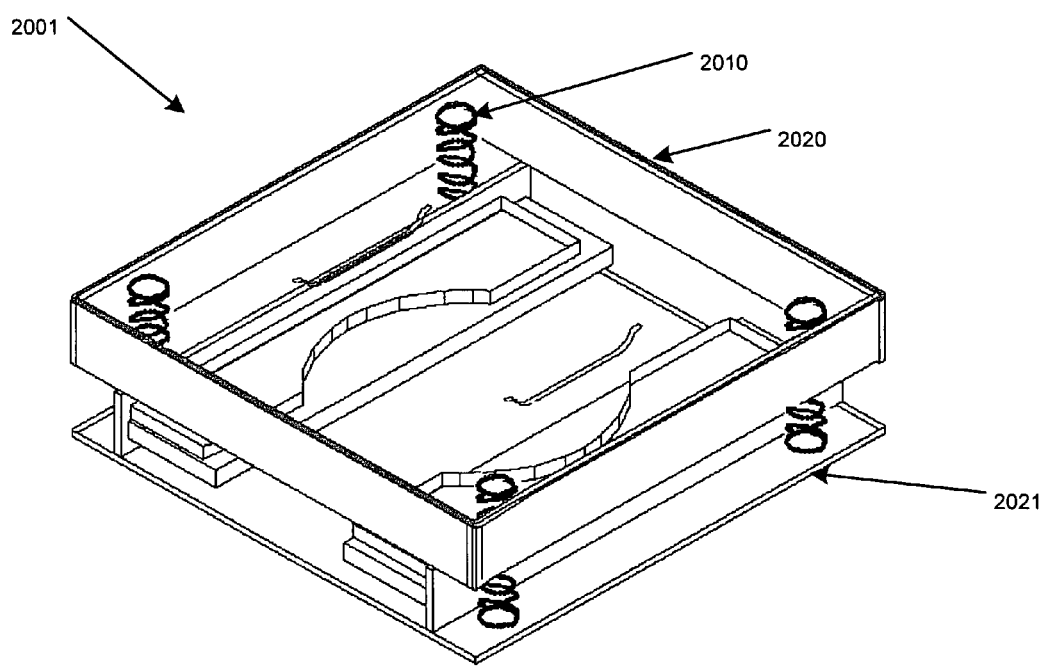
FIG. 20 illustrates an elevation of an open single level carrier with a substrate shaped slot on support rails with helical springs.

Embodiments of the carrier innovation have been depicted for illustration in the various figures with springs shown as bands of material. The generality of the design should be apparent to encompass various types of spring-like material. To illustrate such a variation, FIG. 20 shows an elevation 2001 of a single level carrier with a pocket design having helical type springs 2010. For illustration, such springs can be attached from the top plate 2020 to the bottom plate 2021. Further enhancements such as, for example, sheaths around the springs to contain contamination debris that may be released under movement of the springs is not shown, for clarity of the illustration, but can easily be envisioned as enhancing some embodiments' function as a clean carrier of the substrate, and are therefore within the scope of the present invention.

In various other aspects of the present invention, carriers according to the present invention can be used in the processing of: semiconductor substrates, microelectronic machines, nanotechnology, photonic, and biotechnological applications. Equipment can be incorporated into ports of processing tools to allow for the opening and closing of the carrier. Since substrates can also be transported in the carrier, stand alone units for the loading and unloading of substrates without the presence of a processing tool are also within the scope of the present invention. Since the clean environment of the carrier can need to be maintained, it can also be expected that equipment that can clean the carrier can be made consistent with these design concepts. Stand alone units that open the single substrate carrier and flow liquids or gasses over the internal surfaces to effect particulate and film cleaning are also within the scope of the present invention.

Utility Flange Connectors

When installing a processing tool into a semiconductor fabricator, there are a number of different connections which need to be made to provide utilities, data connections and materials through conduits from the fabrication facility support infrastructure to the individual processing tools. In that traditional processing tools reside in their respective places, typically for the life of the tool, historically there has not been standardized accommodation for an organized placement of these connections in a manner that allows them to be quickly coupled. However, the present invention anticipates routine placement and replacement of processing tools and therefore provides for quick coupling and uncoupling of multiple connections. Specifically, the present invention provides methods an apparatus which allow for the repeatable removal and replacement of processing tooling without the need to weld, glue or otherwise permanently reconstitute conduit connections during each replacement.

Figure 21A:
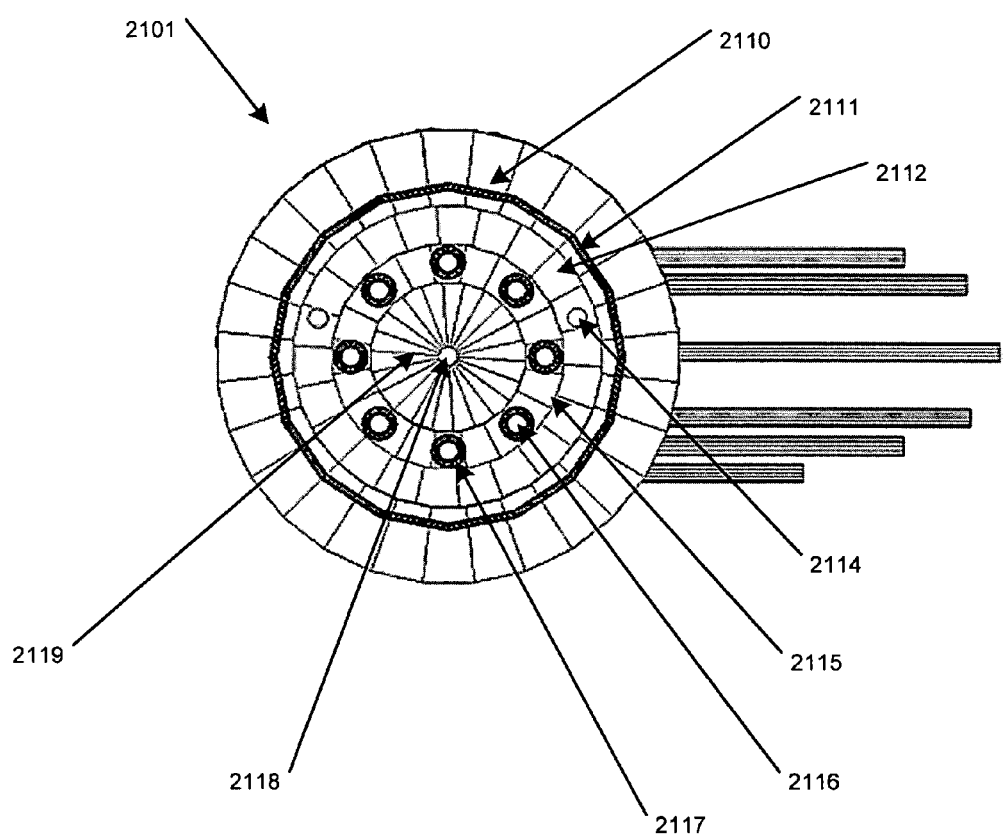
FIG. 21A illustrates a Multiple Gas Flange Top

In another aspect of the present invention, a physical framework is provided for quick standardized connections of materials and utilities to processing tools. Each processing tool can be conceptualized as a "Box" with various processes and operations occurring inside the box. Particular processes and operations are generally unimportant to this disclosure, except in that they define the need for the input and output of materials, utilities, data connections and waste relative to each "Box" to support its operation. The general classes of the materials, utilities and waste relevant to this concept can be liquid chemicals, gaseous chemicals, vacuum, cooling liquids, and utility gas flows for cooling or exhaust. FIG. 21A illustrates exemplary connections between a "Box" and the facility infrastructure.

General classes of materials can each have their own set of technical needs based upon requirements for safe operation, process integrity, cost effectiveness or other related concern. A first class for discussion can include gaseous chemicals. Such chemicals can be further be sub-classified for example as inert, reactive, toxic or pyroforic or a combination of these. Each sub-classification can have the property of being provided under an elevated pressure with high degrees of purity. Thus a means of quickly coupling and decoupling gaseous chemicals will need to address various needs and properties of each classification.

In FIG. 21A a top view of a flange 2101 according to the present invention is presented. The top view illustrates one of two separated sealing surfaces, which, when joined together, seal and provide the sealed connection of the multiple gas conduits that are connected. This one side is illustrated to have an external sealing surface indicated as external sealing surface 2110. On this external sealing surface 2110 is accommodation by either a knife edge or channel for an "O-Ring" seal 2111. Other sealing apparatus, such as a gasket, or malleable ring, may also be used. Moving towards the center, the outer external sealing surface is interrupted by a channel 2112. This channel 2112 allows for the evacuation of air in the internal region of the "O-Ring" seal 2111. Negative atmospheric pressure, such as a relative vacuum, may be established through ports 2114 connecting to the channel.

Electronic monitoring of the vacuum state can be used to facilitate safety, wherein any change in the vacuum state can be assessed to determine if the change denotes a safety hazard or an indication of impurities mixing with gases or materials passing through the flange 2101. The application of a vacuum can facilitate safe use of the flange 2101 during operation and through detection of any leaks in sealing surfaces. Furthermore, miniscule leaks that may be small enough to effect process cleanliness but not large enough for general detection will not result in foreign gases being introduced.

On an inner side of channel 2112 is a second sealing surface 2115 on which multiple conduit sealing junctions 2116 can be arrayed. Each conduit sealing junction 2116 can include a pliable seal, o-ring, brass ring or other interface device capable of forming a gaseous seal. In some embodiments, each conduit sealing junction 2116 can be constructed so that it has the same planar height as the external sealing surface 2110. Embodiments with essentially planar sealing surface heights will invoke a positive sealing aspect with "O-Ring" seal 2111 and at the same time force individual gas line "O-Ring" seals 2117 to seal.

A second sealing surface 2115 can terminate with a second channel 2119. Second channel 2119 can be evacuated with a port 2118 to establish a vacuum condition on either side of the gas line conduit sealing region. In this manner an individually sealed gas line 2113 (FIG. 21B) can be connected to its counterpart on a mating piece allowing for a continuous connection at this entity. Since the region around each conduit's sealing interface is surrounded by a vacuum, safe operations can be assisted. Furthermore, if the vacuum system is connected with vacuum gauges or in situ mass spectrometers then a leak between any of the sealing surfaces can be detected and all gases shut off with electrically activated valves and a corresponding diagnostic message can be sent. In some embodiment, pneumatic valves or other automated valves may also be utilized.

In some embodiments, safe operations can further be enhanced by the incorporation of an electronic ID tag (not illustrated). The tags can uniquely identify each flanging mechanism half. Control electronics capable of interacting with the ID tags can then ensure that the gas lines that will be connected are appropriate.

Figure 21B:
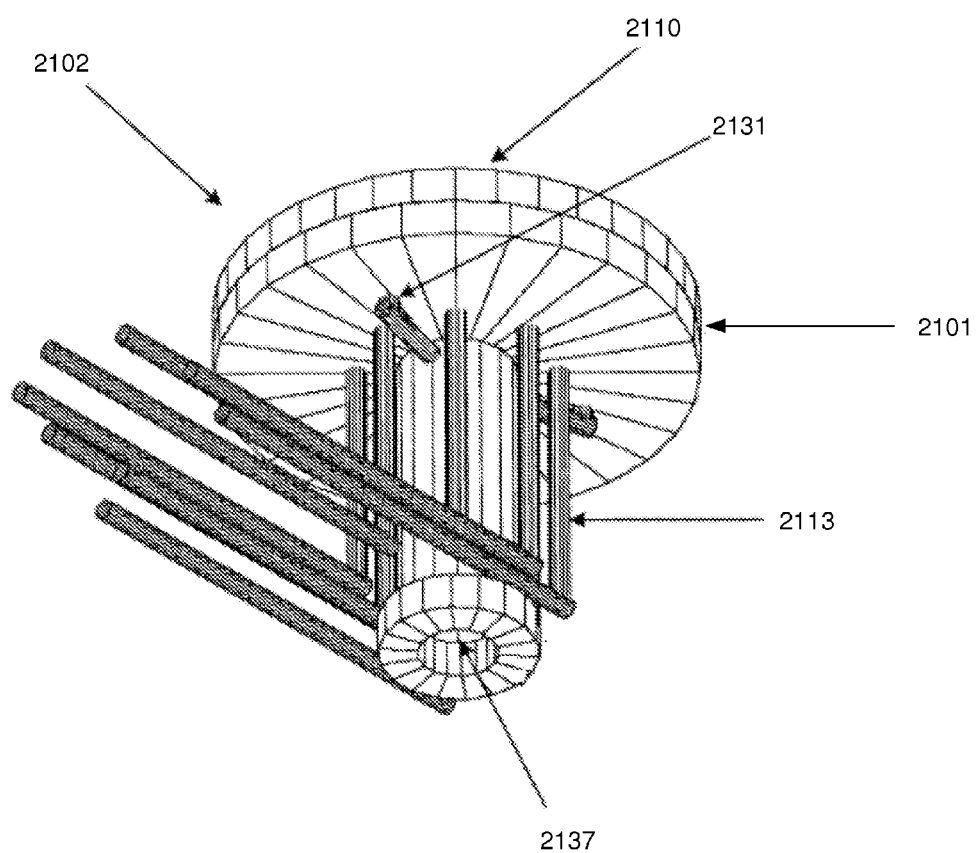
FIG. 21B illustrates a Bottom view of Multiple Gas Flange

Referring Now to FIG. 21B a view 2102 from the bottom of a flange for joining multiple gas lines 2113 is illustrated. The flange 2101 can include a bottom of the external sealing surface 2110 and a set of inner vacuum channels. A connection to the external channel can include a tube 2131 which interfaces with a vacuum line 2137. Each tube which ends with a vacuum flange can act both for support of the flange mechanism shown in view 2102 and for a conduit of vacuum the inner part of which is shown as 2137. Each of the gas lines 2113 can penetrate the flange 2101.

Figure 22:
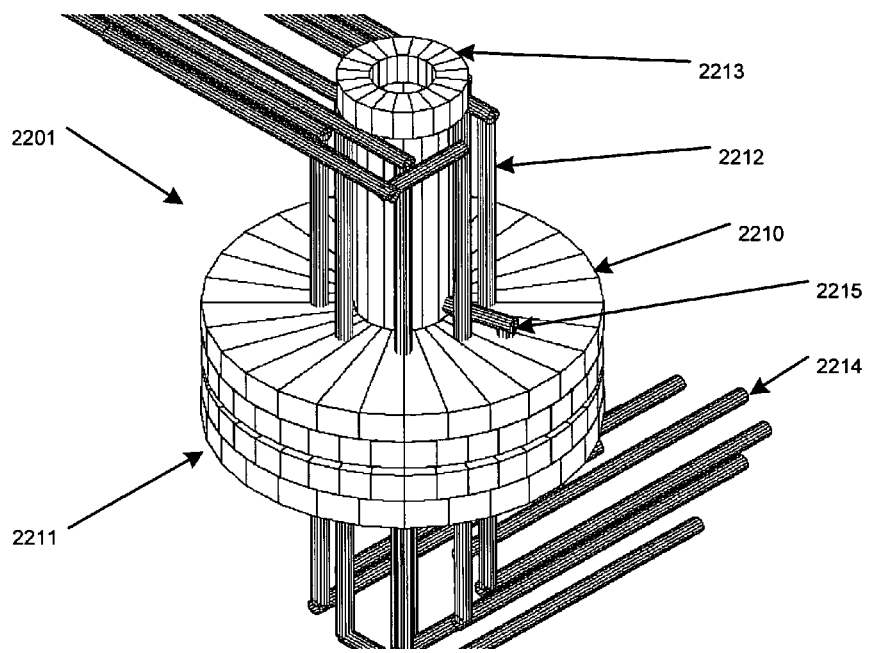
FIG. 22 illustrates an assembly including two faces of a multiple gas connection.

FIG. 22 illustrates some embodiments with two corresponding halves 2201 sealed together. A first flange 2210 which can be considered the "Facility side" flange correlates with connections from conduits that run from various locations in the facility to the process tool. There is also a flange 2211 that can be considered the "Tool side" wherein each facility conduit can have a corresponding conduit bring a material into the process tool. Input gas conduits 2212 are connected to tool gas conduits 2214 in this manner. On the facility side a vacuum source 2213, or other negative atmospheric pressure source, can be connected to a vacuum flange which will both rigidly support the flange 2211 and convey vacuum. In some embodiments, the vacuum source is also connected to the two channels in the flange as shown with the second channel connection 2215.

Figure 23:
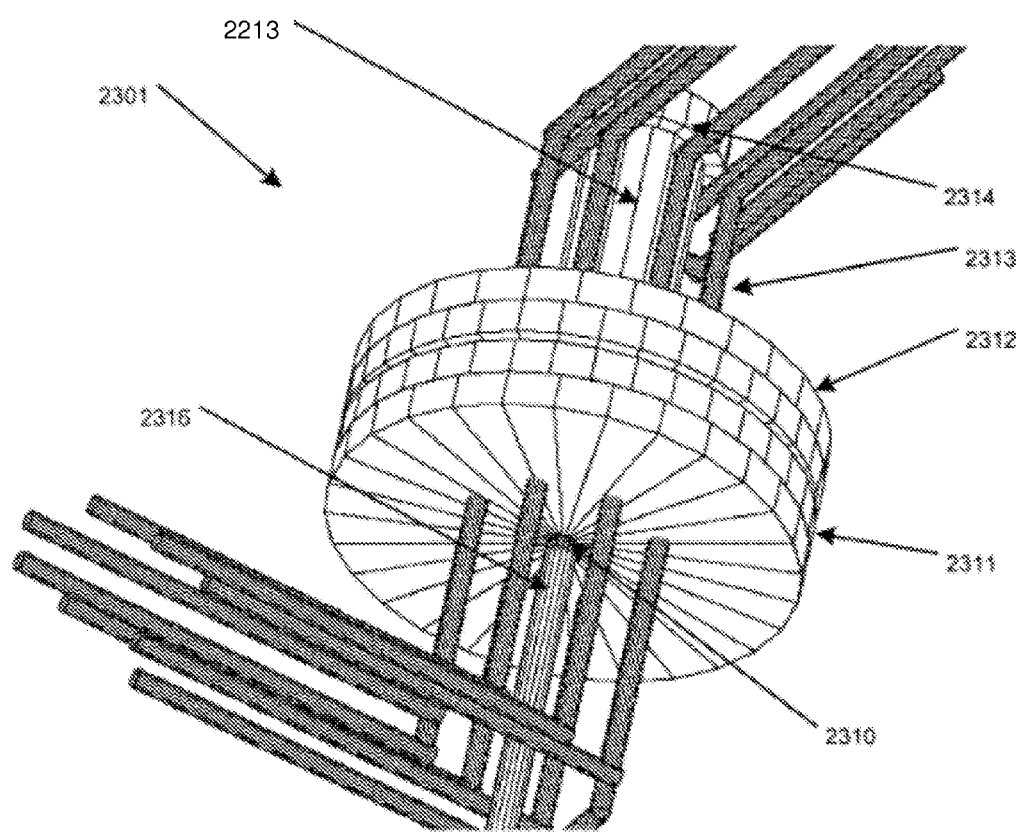
FIG. 23 illustrates a bottom elevation of joined multiple gas connection

Referring now to FIG. 23, a bottom view of a mated set of flanges is illustrated 2301. As described above, a facility side flange piece 2312 can mate with a tool side flange 2311. In these embodiments, a vacuum source 2213 can connect with a rigid tube and flange 2314. In some embodiments, flexibility for tolerances in the plane that the flange surface resides in can be incorporated into a corresponding tool side flange such as tool side flange 2311. A flexible ball joint type coupling 2310 on a shaft 2316 which will allow for some movement to align flange pieces 2311-2312. Once the flange pieces 2311-2312 are mated together the facilities side conduits 2313 are again joined to their corresponding tool side conduits.

Figure 24:
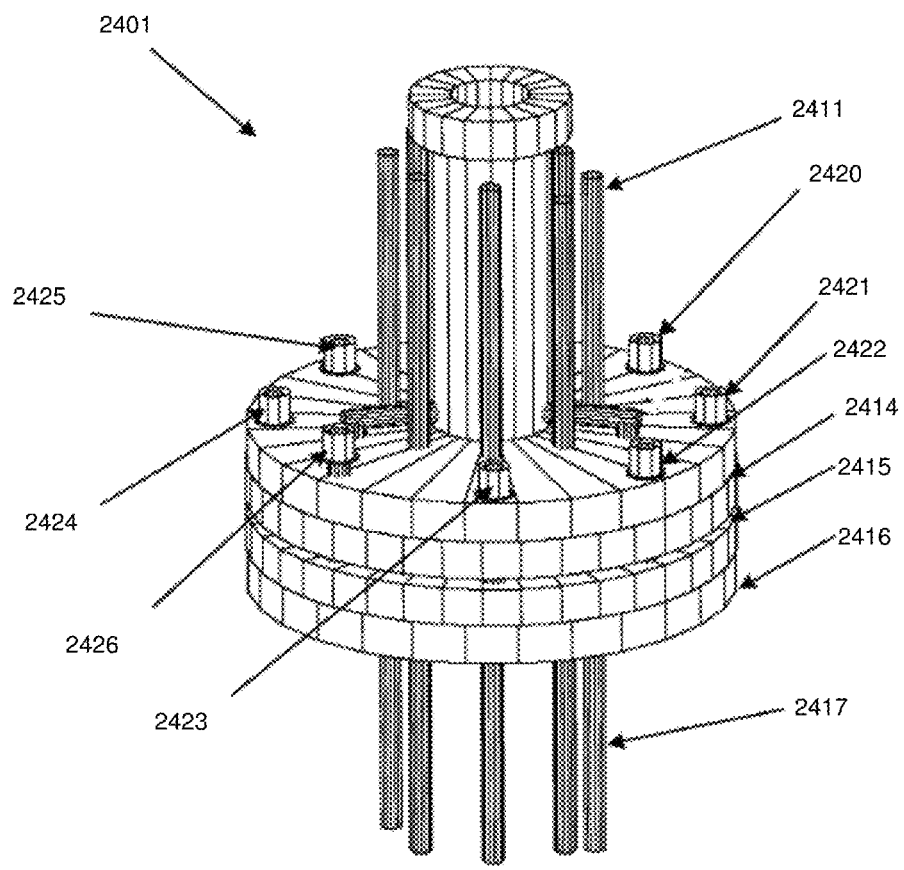
FIG. 24 illustrates an entity sealed with bolts.

Referring now to FIG. 24, in some embodiments, two flanges such as facility side flange 2414, and tool side flange 2416 can be joined together with enough compressional force onto facility side flange 2414 and tool side flange 2416 to close a gap 2415 between them. This will put compressional force onto the O-Ring seals shown in FIG. 21A as "O-Ring" 2111 and "O-Ring" 2117 to ensure an integral seal. In some embodiments, threaded bolts 2420-2426 can be used to apply the requisite compressional force. The bolts 2420-2426 can tighten into previously tapped holes in the tool side flange 2416, or with threaded nuts (not shown) mated on an opposite side of the flange 2401. One of the bolts 2426 is illustrated for reference in a non tightened position. Depending on the nature of the o-ring material, the torque on each of the bolts 2420-2426 can be adjusted to ensure all sealing surfaces are leak proof, in which case corresponding gasses can flow without leaks either out of or into the conduits, conduit 2411 and conduit 2417 that are joined together.

Figure 25:
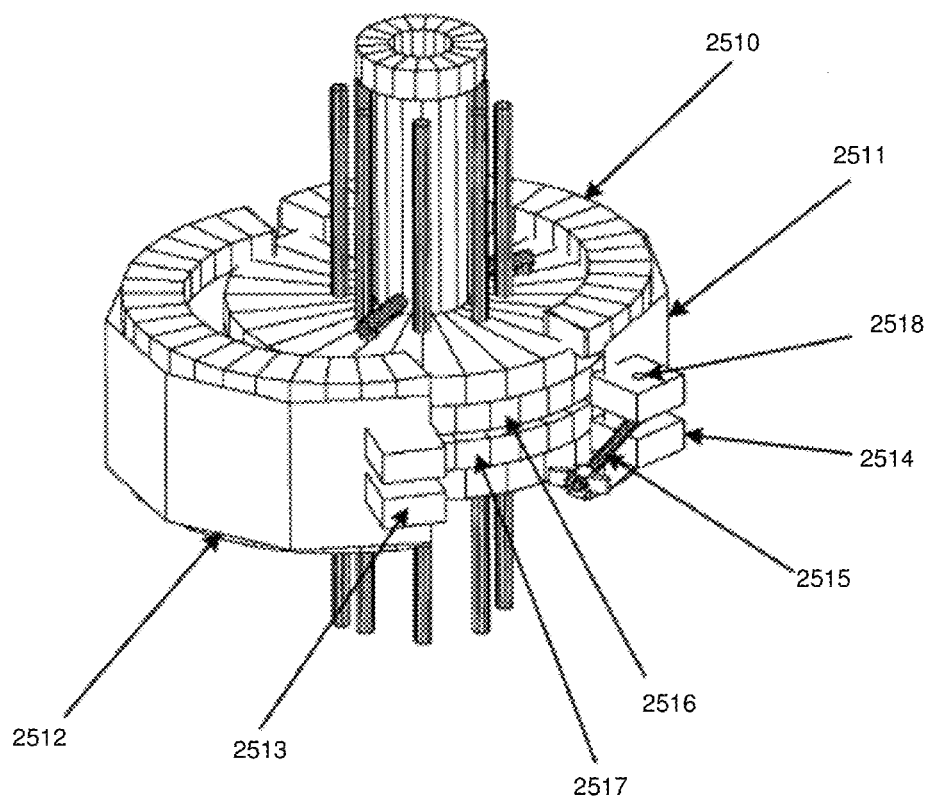
FIG. 25 illustrates an entity sealed clamped force

Referring now to FIG. 25, in some additional embodiments, a clamping mechanism 2511 can include opposing faces 2510 and 2512 with beveled edges. The opposing faces 2510 and 2512 can be tightened together causing compressional force to be placed on the two flange faces and thereby force the flanges 2516-2517 together and seal internal o-rings (not shown). In some exemplary embodiments, clamping mechanism 2511 is pulled together with a wing nut assembly 2515. When the wing nut assembly 2515 is tightened, capturing face 2513 is drawn towards an opposing face or other holding point 2514. The wing nut assembly 2515 can be held, for example, on an axle 2518.

Figure 26:
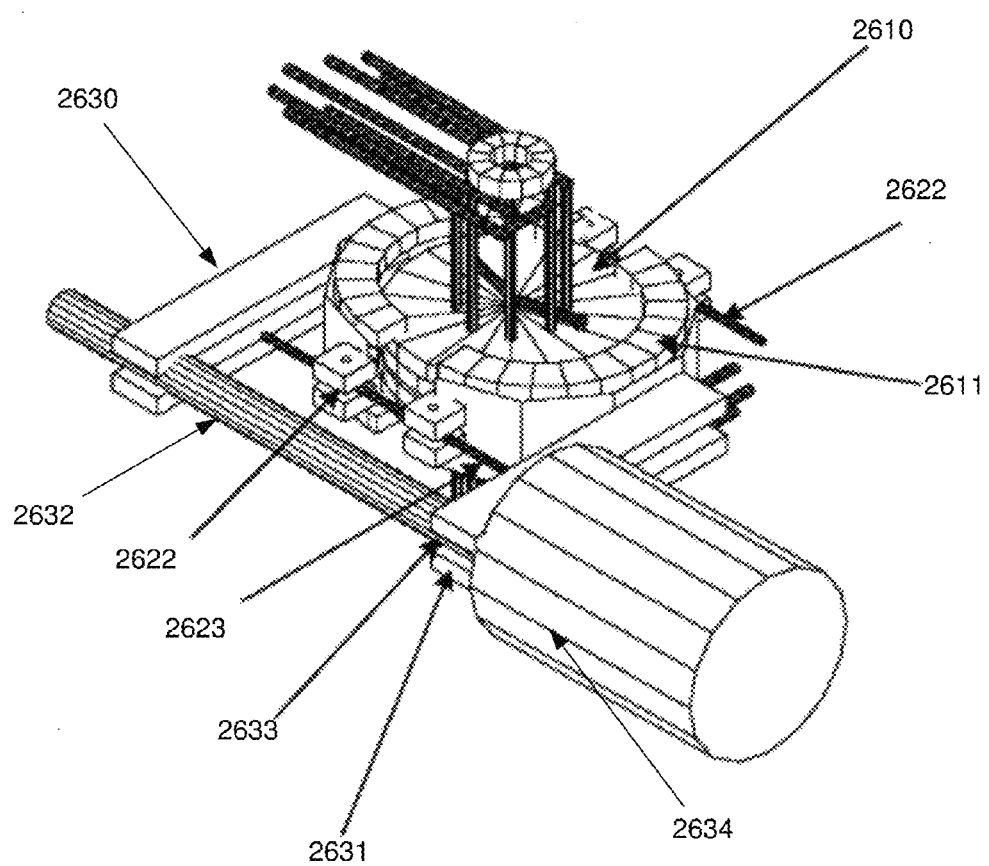
FIG. 26 illustrates an entity with motorized sealing concept

Referring now to FIG. 26, in some embodiments, an automated flange sealing mechanism can be operated, for example, via an electric or pneumatic motor. For example, a lead screw 2632 attached to a stepping motor or a pneumatic motor 2634 can put force on brackets 2630 and 2631 compressing them together and thereby pushing the clamps around the two sealing flanges 2610. Embodiments can therefore include the capturing device 2611 with shafts 2622, 2623 that can guide linear movement of the two sealing flanges 2610. In much the same way by bringing the two flanges together a compressional force will act on the o-rings thus creating a seal between the o-rings and the flange faces.

Figure 27:
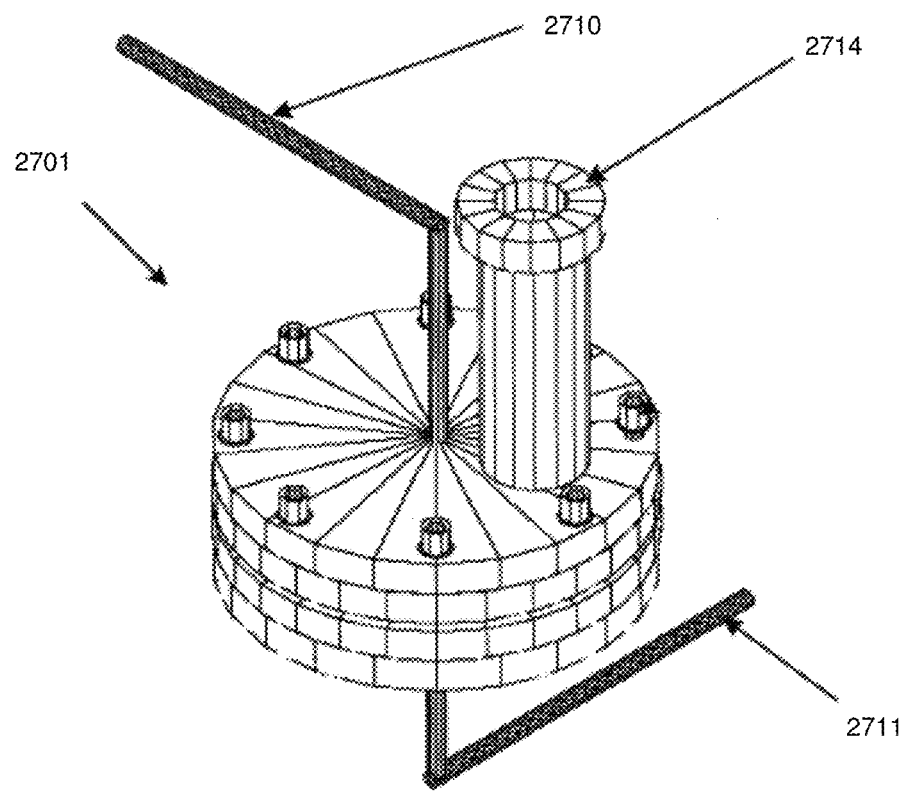
FIG. 27 illustrates an implementation of a single gas or fluid.

Referring now to FIG. 27, flange devices that have been shown thus far have allowed for multiple gas conduits to be rapidly connected and unconnected. As previously mentioned, in some embodiments, it is possible to have gasses that are either highly toxic or have other safety issues that make it more desirable to isolate the gas from others. In FIG. 27 a device implementing the concepts of the present invention for a single gas line is illustrated. The facilities side of a single gas line 2710 and a tool side of the gas line 2711 can be joined with a flange 2701. Furthermore, as discussed above, the flange 2701 can still have accommodation for an evacuated channel surrounding the gas interface seal. The vacuum for the channel can again be provided by a flange to tube connection 2714 that will provide both physical support and also a source of negative atmospheric pressure.

Figure 28:
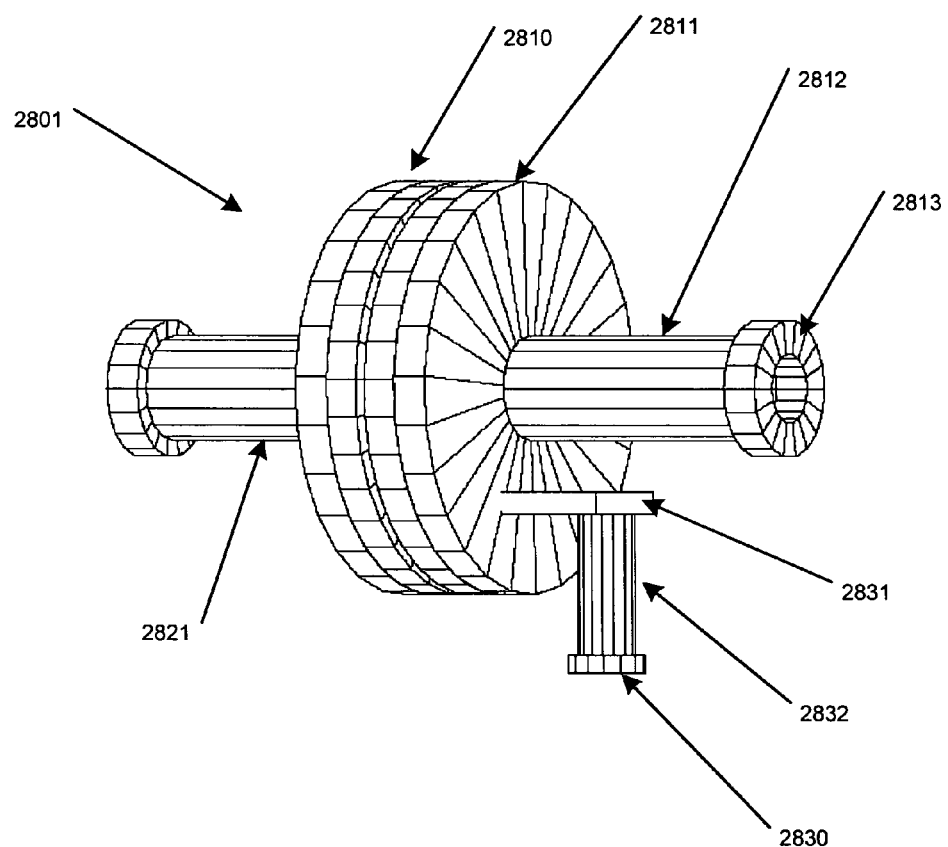
FIG. 28 illustrates an example of a liquid version of a quick sealing mechanism.

Referring now to FIG. 28, in general, processing tools may require connections to materials other than gasses. One type of additional material includes liquid chemicals. The fundamental aspects of implementations of the present invention directed to carrying liquids are similar to those described above for gases. Depending on the material in question it may be desirable to provide multiple connections through the same flange or as is illustrated in FIG. 28 a single liquid chemical. Aspects which depend on the nature of the chemical to be conveyed can include, for example: the material comprising the flange, o-rings, and connections can be designated to ensure chemical compatibility. Accordingly, while a typical material for construction of a device to convey gasses can be stainless steel, a material for construction of a device to convey a liquid chemical can be Teflon.

A flange connector 2801 to chemical lines on the tool side of the interface can connect an output line 2821 of a tool side flange 2810 according to the present invention to a processing tool supply line. The flanging device will have a tool side flange 2810 and a facilities side flange 2811 as well. Chemical input to the flange will likewise be done with line 2812 and connector 2813. Instead of the vacuum shown in the gas devices a chemical drain connection can be used to both detect and safely contain leaks. Channel connection 2831 is indicated to show a channel connection that will connect tube 2832 to a drain channel (not shown in FIG. 28) existing on the inside of the flanges. The drain can be connected to a facilities drain system with tube 2832 and connector 2830.

Figure 29:
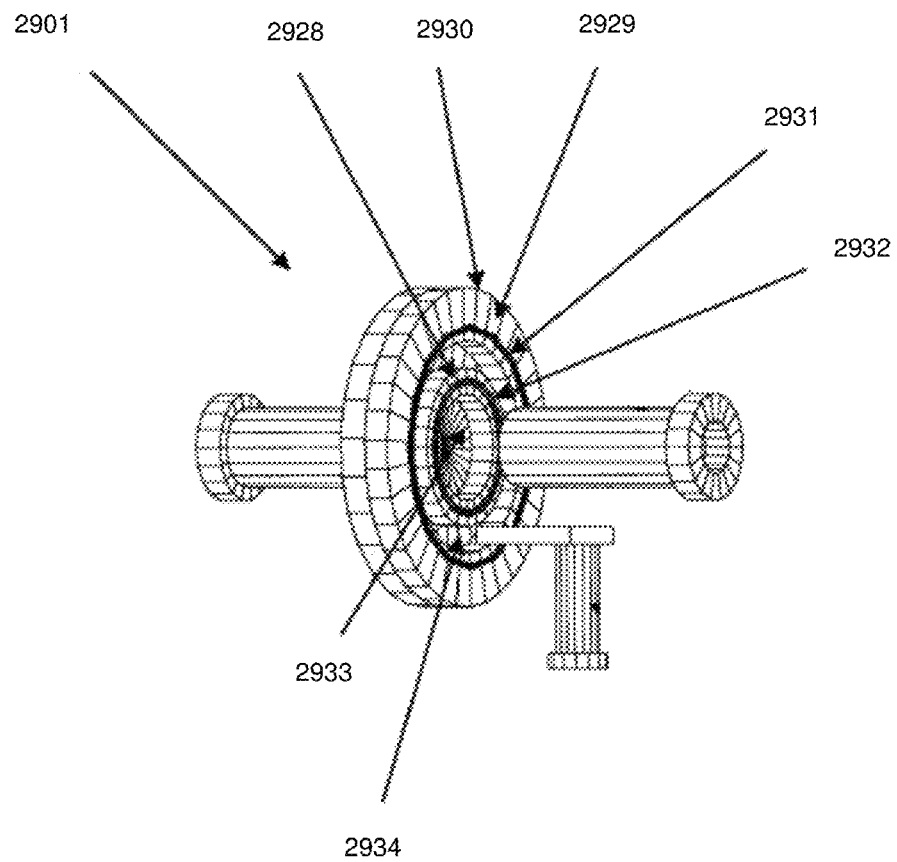
FIG. 29 illustrates an "exploded" version of a chemical flange.

Referring now to FIG. 29, embodiments of the present invention including a flange assembly 2901 which incorporates draining functionality is illustrated. A cutaway of a facilities side flange 2930 shows both sealing surfaces 2931-2932 and channels 2933-2934. Exterior sealing surface 2929 incorporates o-ring 2931 for sealing. Channel 2934 is formed into the facilities side flange 2930 to allow for draining. On the other side of the channel is a second sealing surface 2928 and o-ring 2932. The second sealing surface 2928 is what will seal the chemical channel 2933 on both flange surfaces so that the flange assembly 2901 can convey a chemical.

In some embodiments, automated chemical detectors can provide an alert to a situation of a chemical leak in the second sealing surface 2928. In an analogous fashion to the vacuum system with gasses such detectors can also be operative to automatically shut off the chemical flow to the flange with appropriate valves.

Figure 30:
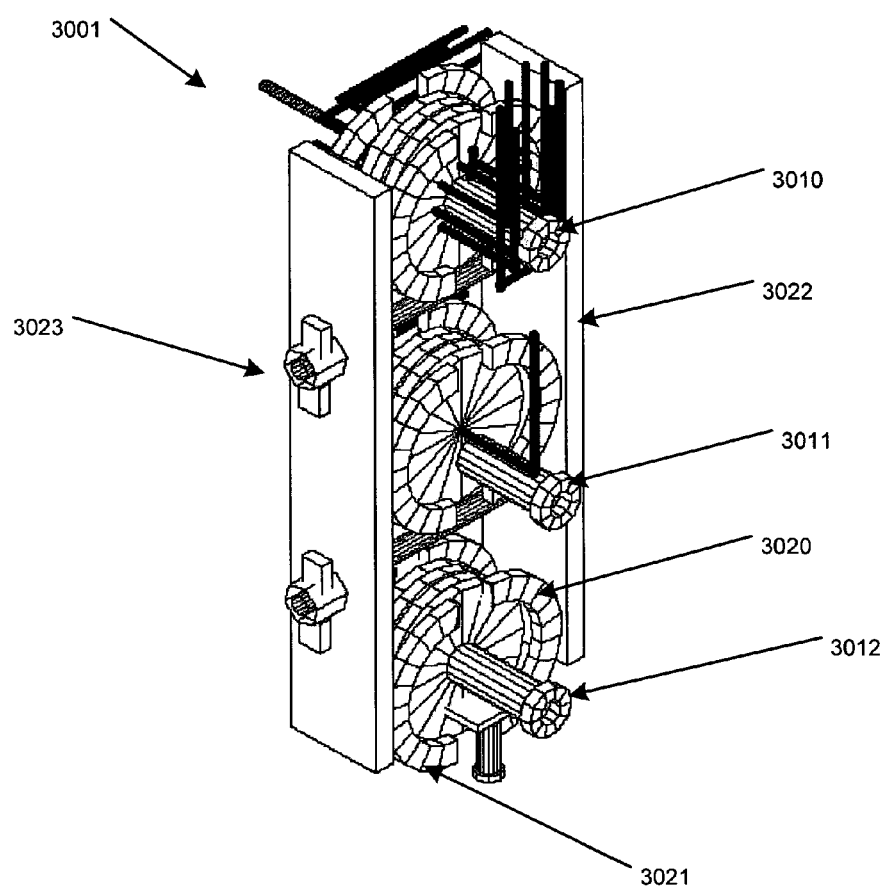
FIG. 30 illustrates a "manifold" of various types of quick connection flanges.

Referring now to FIG. 30, the ability of flanges to convey both liquids and gasses and to accommodate vacuum and chemical drains enables a combination of flanges of the above design types, to be assembled and thereby provide an integrated package for quick connect and disconnect of process tooling from the fab environment.

To illustrate a quick disconnect multiport, FIG. 30 shows a combination of a multiport gas flange interface 3010, a single gas flange 3011 and a single chemical interface 3012. By combining multiple flanges a single entity including multiport flange 3001, flange closure devices 3020 and 3021, which can be operative to ultimately apply compression to o-ring seals contained in the respective flanges can be formed. For example, operation of flange closing devices 3022 can be operative to engage multiple compressive closure devices in a single action. Specific examples can include a threaded nut 3023 that can be tightened to provide closure force and assemble and seal the three different flanges.

It is to be understood, that although various specific embodiments have been described, including a multiport flange 3001, individual nuts as shown as item 2420 in FIG. 24, or with a motorized lead screw solution 2633 illustrated in FIG. 26, various other embodiments, including a combination of flanges 2101-2901 can constitute all the materials inflow and outflow to a processing tool. A processing tool can therefore be connected through an interface that is quickly assembled and disassembled as might be the case when a tool is routinely being installed or removed from a cleanspace position.

Figure 31:
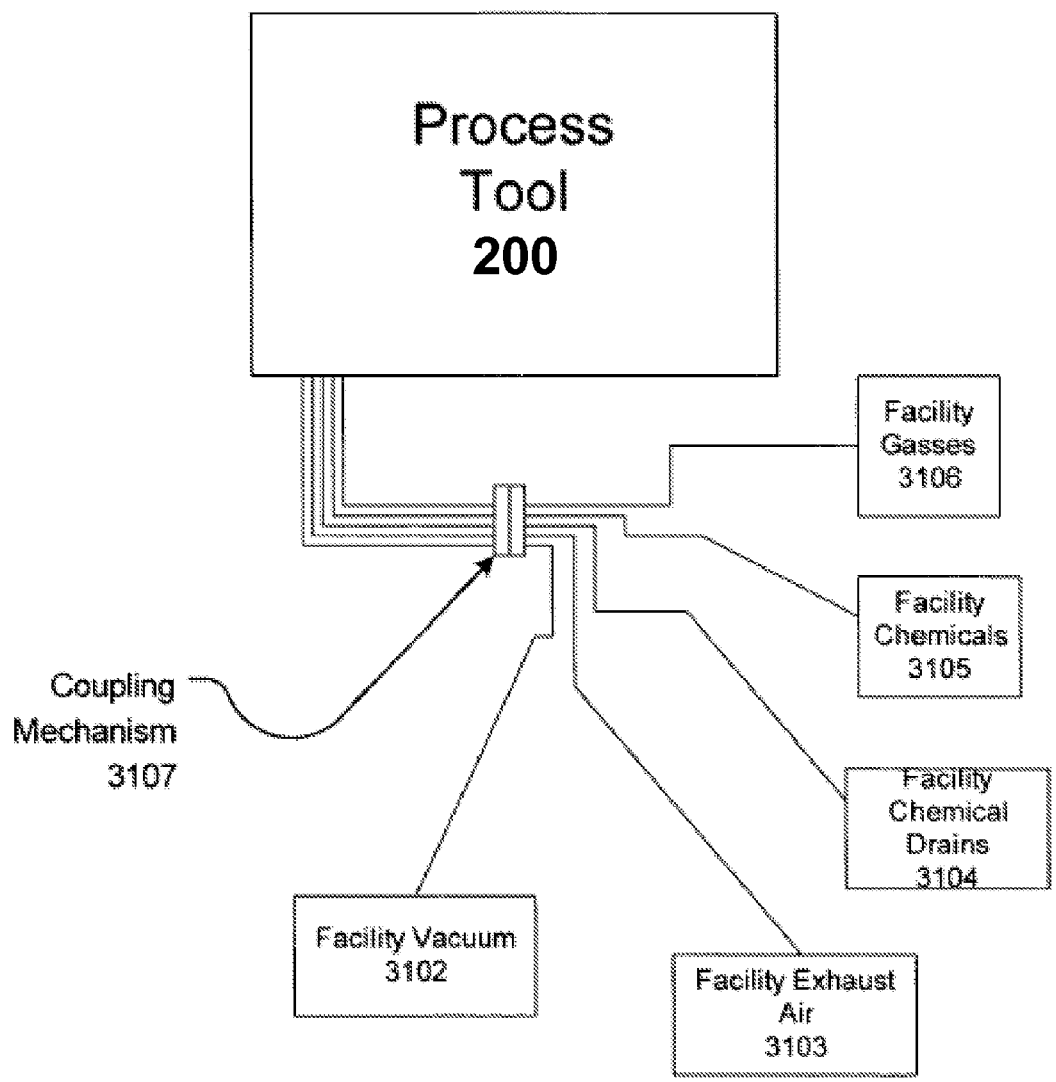
FIG. 31 illustrates a schematic representation implementing some embodiments of the present invention.

Referring now to FIG. 31, a block diagram illustrates exemplary functionality that can be provided to a processing tool 200 via a single quick disconnect coupling mechanism 3107. For example, in some embodiments, two or more of: facility vacuum 3102, facility exhaust air 3103, facility chemical drains 3104, facility chemicals 3105 and facility gasses 3106 can be connected and disconnected via a single quick disconnect coupling mechanism 3107 or flange.

Figure 32:
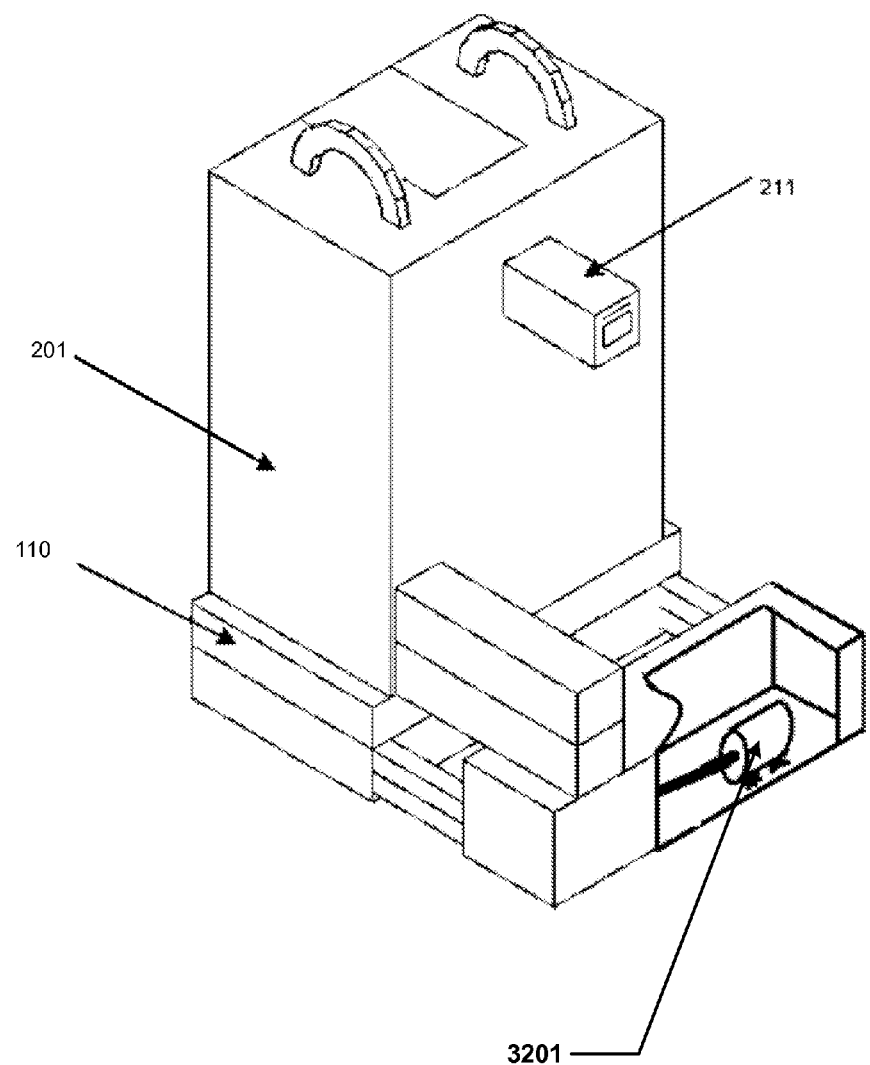
FIG. 32 Front View with Tool Body Placed and Motor Visible

Referring to FIG. 32, a tool body 201 can be placed onto the chassis plate 110. The tool body 201 and tool port 211 are illustrated in a particular form, however, any type of processing tool, such as those required for semiconductor manufacture, is within the scope of the invention. In some embodiments, the underside of a tool body 201 can include a mating plate which physically interfaces with a chassis plate 110. Also shown is a motor 3201 linked to the base plate for sliding the base plate from the extended position to the closed position.

Some embodiments of the present invention which relate to the specific application of semiconductor fabrication have been described in order to better demonstrate various useful aspects of the invention. However, such exemplary descriptions are not meant to limit the application of the inventive concepts described herein in any way. Embodiments may therefore include, for example, applications in research and generation of: pharmaceutical products, nanostructure products and other applications which benefit from the availability of cleanspace and multiple processing tools.

GLOSSARY OF SELECTED TERMS

Air receiving wall: a boundary wall of a cleanspace that receives air flow from the cleanspace.

Air source wall: a boundary wall of a cleanspace that is a source of clean air flow into the cleanspace.

Annular: The space defined by the bounding of an area between two closed shapes one of which is internal to the other.

Automation: The techniques and equipment used to achieve automatic operation, control or transportation.

Ballroom: A large open cleanroom space devoid in large part of support beams and walls wherein tools, equipment, operators and production materials reside.

Batches: A collection of multiple substrates to be handled or processed together as an entity.

Boundaries: A border or limit between two distinct spaces—in most cases herein as between two regions with different air particulate cleanliness levels.

Circular: A shape that is or nearly approximates a circle.

Clean: A state of being free from dirt, stain, or impurities—in most cases herein referring to the state of low airborne levels of particulate matter and gaseous forms of contamination.

Cleanspace: A volume of air, separated by boundaries from ambient air spaces, that is clean.

Cleanspace, Primary: A cleanspace whose function, perhaps among other functions, is the transport of jobs between tools.

Cleanspace, Secondary: A cleanspace in which jobs are not transported but which exists for other functions, for example as where tool bodies may be located.

Cleanroom: A cleanspace where the boundaries are formed into the typical aspects of a room, with walls, a ceiling and a floor.

Core: A segmented region of a standard cleanroom that is maintained at a different clean level. A typical use of a core is for locating the processing tools.

Ducting: Enclosed passages or channels for conveying a substance, especially a liquid or gas—typically herein for the conveyance of air.

Envelope: An enclosing structure typically forming an outer boundary of a cleanspace.

Fab (or fabricator): An entity made up of tools, facilities and a cleanspace that is used to process substrates.

Fit up: The process of installing into a new clean room the processing tools and automation it is designed to contain.

Flange: A protruding rim, edge, rib, or collar, used to strengthen an object, hold it in place, or attach it to another object. Typically herein, also to seal the region around the attachment.

Folding: A process of adding or changing curvature.

HEPA: An acronym standing for high-efficiency particulate air. Used to define the type of filtration systems used to clean air.

Horizontal: A direction that is, or is close to being, perpendicular to the direction of gravitational force.

Job: A collection of substrates or a single substrate that is identified as a processing unit in a fab. This unit being relevant to transportation from one processing tool to another.

Logistics: A name for the general steps involved in transporting a job from one processing step to the next. Logistics can also encompass defining the correct tooling to perform a processing step and the scheduling of a processing step.

Multifaced: A shape having multiple faces or edges.

Nonsegmented Space: A space enclosed within a continuous external boundary, where any point on the external boundary can be connected by a straight line to any other point on the external boundary and such connecting line would not need to cross the external boundary defining the space.

Perforated: Having holes or penetrations through a surface region. Herein, said penetrations allowing air to flow through the surface.

Peripheral: Of, or relating to, a periphery.

Periphery: With respect to a cleanspace, refers to a location that is on or near a boundary wall of such cleanspace. A tool located at the periphery of a primary cleanspace can have its body at any one of the following three positions relative to a boundary wall of the primary cleanspace: (i) all of the body can be located on the side of the boundary wall that is outside the primary cleanspace, (ii) the tool body can intersect the boundary wall or (iii) all of the tool body can be located on the side of the boundary wall that is inside the primary cleanspace. For all three of these positions, the tool's port is inside the primary cleanspace. For positions (i) or (iii), the tool body is adjacent to, or near, the boundary wall, with nearness being a term relative to the overall dimensions of the primary cleanspace.

Planar: Having a shape approximating the characteristics of a plane.

Plane: A surface containing all the straight lines that connect any two points on it.

Polygonal: Having the shape of a closed figure bounded by three or more line segments Process: A series of operations performed in the making or treatment of a product—herein primarily on the performing of said operations on substrates.

Robot: A machine or device, that operates automatically or by remote control, whose function is typically to perform the operations that move a job between tools, or that handle substrates within a tool.

Round: Any closed shape of continuous curvature.

Substrates: A body or base layer, forming a product, that supports itself and the result of processes performed on it.

Tool: A manufacturing entity designed to perform a processing step or multiple different processing steps. A tool can have the capability of interfacing with automation for handling jobs of substrates. A tool can also have single or multiple integrated chambers or processing regions. A tool can interface to facilities support as necessary and can incorporate the necessary systems for controlling its processes.

Tool Body: That portion of a tool other than the portion forming its port.

Tool Port: That portion of a tool forming a point of exit or entry for jobs to be processed by the tool. Thus the port provides an interface to any job-handling automation of the tool.

Tubular: Having a shape that can be described as any closed figure projected along its perpendicular and hollowed out to some extent.

Unidirectional: Describing a flow which has a tendency to proceed generally along a particular direction albeit not exclusively in a straight path. In clean air flow, the unidirectional characteristic is important to ensuring particulate matter is moved out of the cleanspace.

Unobstructed removability: refers to geometric properties, of fabs constructed in accordance with the present invention, that provide for a relatively unobstructed path by which a tool can be removed or installed.

Utilities: A broad term covering the entities created or used to support fabrication environments or their tooling, but not the processing tooling or processing space itself. This includes electricity, gasses, air flows, chemicals (and other bulk materials) and environmental controls (e.g., temperature).

Vertical: A direction that is, or is close to being, parallel to the direction of gravitational force.

While the invention has been described in conjunction with specific embodiments, it is evident that many alternatives, modifications and variations will be apparent to those skilled in the art in light of the foregoing description.

Accordingly, this description is intended to embrace all such alternatives, modifications and variations as fall within its spirit and scope.

What is claimed is:

1. A fab for processing a substrate, the fab comprising:
   a primary cleanspace, a secondary space independent of the cleanspace, and a first wall between the primary cleanspace and the secondary space;
   a first processing tool comprising a tool body and a tool port, the first processing tool configured to process a substrate;
   a processing tool positioning apparatus comprising a chassis for mounting the first processing tool onto, said chassis comprising:
      a chassis plate comprising a mating surface for receiving the tool body of the first processing tool, and
      a base plate for positioning the chassis plate in an extended position and a closed position;
   wherein when the first processing tool is mated to the chassis plate and the chassis plate is in the closed position, the tool port penetrates through the first wall, is sealed with respect to the first wall and is positioned within the primary cleanspace and the tool body of the first processing tool is exterior to the primary cleanspace within the secondary space; and
   wherein when the first processing tool is mated to the chassis plate and the chassis plate assumes the extended position, the tool port is removed from the primary cleanspace without requiring removal of an adjacent processing tool.

2. The fab of claim 1 wherein the mating surface comprises tabs protruding from the surface, wherein the tabs are functional for aligning the tool body received thereon.

3. The fab of claim 2 wherein the tabs are additionally operative for providing electrical connection for one or more of: electrical power and data signal.

4. The fab of claim 1 additionally comprising a flange portion operative to connect utility conduits to the processing tool, said utility conduits comprising one or more of: chemical gas supply, liquid supply, electric power supply and data signal connection.

5. The fab of claim 4 wherein the flange portion comprises multiple primary sealing surfaces, each primary sealing surface for supply of a discrete utility service.

6. The fab of claim 5 wherein the flange portion additionally comprises one or more secondary sealing surfaces operative to seal any gas or liquid leaking from any of the multiple primary sealing surfaces from entering an ambient atmosphere.

7. The fab of claim 4 wherein the flange portion additionally comprises a pliable seal.

8. The fab of claim 4 wherein the flange portion additionally comprises a channel for maintaining a negative atmospheric pressure around a seal containing the chemical gas supply, said negative atmospheric pressure operative to evacuate any chemical gas supply leaking from the seal.

9. The fab of claim 1 additionally comprising a rail on which the chassis plate can slide from the extended position to the closed position.

10. The fab of claim 1 additionally comprising a motor linked to the chassis plate for sliding the chassis plate from the extended position to the closed position.

11. The fab of claim 1 additionally comprising automation for transporting the substrate from the tool port of the first processing tool mounted on the chassis plate to a second tool port of a second processing tool mounted on a second chassis plate.

12. The fab of claim 11 additionally comprising a control panel to track a location of the substrate.

13. The fab of claim 11 additionally comprising a control panel to track an identity of multiple tools and a status of the multiple tools.

14. A fab for processing a substrate, the fab comprising:
   a primary cleanspace, a secondary space independent of the primary cleanspace, and a first wall between the primary cleanspace and the secondary space;
   a substrate processing tool comprising a tool body and a tool port;
   an apparatus for positioning the substrate processing tool in the fab;
   the apparatus comprising:
      a chassis for mounting the processing tool onto, said chassis comprising:
         a chassis plate comprising a mating surface for receiving the tool body of the substrate processing tool, and
         a base plate for positioning the chassis plate in an extended position and a closed position;
   wherein when the processing tool is mated to the chassis plate and the chassis assumes the closed position, the tool port of the substrate processing tool penetrates through the first wall, is sealed with respect to the first wall, and is positioned within the primary cleanspace and the tool body is exterior to the primary cleanspace within the secondary space;
   wherein when the processing tool is mated to the chassis plate and the chassis plate assumes the extended position, the tool port is removed from the primary cleanspace without requiring removal of an adjacent processing tool, and
   a logistics apparatus for transferring a substrate carrier carrying a substrate to the tool port while the tool port is sealed within the primary cleanspace.

15. The fab of claim 14 wherein the processing tool comprises multiple integrated chambers.

16. The fab of claim 15 wherein the substrate being carried in the substrate carrier comprises a semiconductor.

17. The fab of claim 14 wherein the tool body may be removed from the base plate after the chassis plate is moved to the extended position and such removal does not require removal of an adjacent tool body.

* * * * *